US011521935B2

(12) United States Patent
Chen et al.

(10) Patent No.: US 11,521,935 B2
(45) Date of Patent: Dec. 6, 2022

(54) PACKAGE STRUCTURE AND FABRICATION METHODS

(71) Applicant: Applied Materials, Inc., Santa Clara, CA (US)

(72) Inventors: Han-Wen Chen, Cupertino, CA (US); Steven Verhaverbeke, San Francisco, CA (US); Giback Park, San Jose, CA (US); Giorgio Cellere, Torri di Quartesolo (IT); Diego Tonini, Treviso (IT); Vincent Dicaprio, Pleasanton, CA (US); Kyuil Cho, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 59 days.

(21) Appl. No.: 17/227,811

(22) Filed: Apr. 12, 2021

(65) Prior Publication Data

US 2021/0257306 A1    Aug. 19, 2021

Related U.S. Application Data

(63) Continuation of application No. 16/687,567, filed on Nov. 18, 2019, now Pat. No. 11,264,331.

(30) Foreign Application Priority Data

May 10, 2019    (IT) .......................... 102019000006736

(51) Int. Cl.
*H01L 23/495*    (2006.01)
*H01L 23/538*    (2006.01)
(Continued)

(52) U.S. Cl.
CPC ........ *H01L 23/5389* (2013.01); *H01L 21/486* (2013.01); *H01L 21/4864* (2013.01);
(Continued)

(58) Field of Classification Search
CPC ............. H01L 23/5384; H01L 23/5389; H01L 23/147; H01L 23/49827; H01L 23/49894
(Continued)

(56) References Cited

U.S. PATENT DOCUMENTS 4,073,610 A    2/1978    Cox
5,126,016 A    6/1992    Glenning et al.
(Continued)

FOREIGN PATENT DOCUMENTS

CA    2481616 C    1/2013
CN    1971894 A    5/2007
(Continued)

OTHER PUBLICATIONS

U.S. Office Action dated May 13, 2021, in U.S. Appl. No. 16/870,843.
(Continued)

*Primary Examiner* — Nitin Parekh
(74) *Attorney, Agent, or Firm* — Patterson + Sheridan, LLP

(57) ABSTRACT

The present disclosure relates to methods and apparatus for forming a thin-form-factor semiconductor package. In one embodiment, a glass or silicon substrate is structured by micro-blasting or laser ablation to form structures for formation of interconnections therethrough. The substrate is thereafter utilized as a frame for forming a semiconductor package with embedded dies therein.

20 Claims, 25 Drawing Sheets

(51) Int. Cl.
*H01L 21/48* (2006.01)
*H01L 23/13* (2006.01)
*H01L 23/14* (2006.01)
*H01L 23/498* (2006.01)
*H01L 25/10* (2006.01)
*H01L 23/66* (2006.01)
*H01Q 1/22* (2006.01)
*H01Q 1/24* (2006.01)
*H05K 1/02* (2006.01)
*H01L 21/50* (2006.01)
*H01L 21/768* (2006.01)
*H01L 25/065* (2006.01)
*H01L 27/06* (2006.01)
*H01L 21/60* (2006.01)

(52) U.S. Cl.
CPC ........ *H01L 21/50* (2013.01); *H01L 21/76802* (2013.01); *H01L 23/13* (2013.01); *H01L 23/147* (2013.01); *H01L 23/49827* (2013.01); *H01L 23/49838* (2013.01); *H01L 23/49866* (2013.01); *H01L 23/49894* (2013.01); *H01L 23/5384* (2013.01); *H01L 23/5385* (2013.01); *H01L 23/5386* (2013.01); *H01L 23/66* (2013.01); *H01L 25/0657* (2013.01); *H01L 25/105* (2013.01); *H01L 27/0688* (2013.01); *H01Q 1/2283* (2013.01); *H01Q 1/243* (2013.01); *H05K 1/0243* (2013.01); *H01L 2021/60007* (2013.01); *H01L 2225/107* (2013.01); *H01L 2225/1035* (2013.01)

(58) Field of Classification Search
USPC .......................................................... 257/774
See application file for complete search history.

(56) References Cited

U.S. PATENT DOCUMENTS

| | | |
|---|---|---|
| 5,268,194 A | 12/1993 | Kawakami et al. |
| 5,353,195 A | 10/1994 | Fillion et al. |
| 5,367,143 A | 11/1994 | White, Jr. |
| 5,374,788 A | 12/1994 | Endoh et al. |
| 5,474,834 A | 12/1995 | Tanahashi et al. |
| 5,670,262 A | 9/1997 | Dalman |
| 5,767,480 A | 6/1998 | Anglin et al. |
| 5,783,870 A | 7/1998 | Mostafazadeh et al. |
| 5,841,102 A | 11/1998 | Noddin |
| 5,878,485 A | 3/1999 | Wood et al. |
| 6,039,889 A | 3/2000 | Zhang et al. |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,713,719 B1 | 3/2004 | De Steur et al. |
| 6,724,638 B1 | 4/2004 | Inagaki et al. |
| 6,775,907 B1 | 8/2004 | Boyko et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 | 10/2007 | Shimoishizaka et al. |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |

(56) References Cited

U.S. PATENT DOCUMENTS

| | | |
|---|---|---|
| 9,275,934 B2 | 3/2016 | Sundaram et al. |
| 9,318,376 B1 | 4/2016 | Holm et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,837,484 B2 | 12/2017 | Jung et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,893,045 B2 | 2/2018 | Pagaila et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2008/0006945 A1 | 1/2008 | Lin et al. |
| 2008/0011852 A1 | 1/2008 | Gu et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0296273 A1 | 12/2008 | Lei et al. |
| 2009/0084596 A1 | 4/2009 | Inoue et al. |
| 2009/0243065 A1 | 10/2009 | Sugino et al. |
| 2009/0250823 A1 | 10/2009 | Racz et al. |
| 2009/0278126 A1 | 11/2009 | Yang et al. |
| 2010/0013081 A1 | 1/2010 | Toh et al. |
| 2010/0062287 A1 | 3/2010 | Beresford et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0169133 A1* | 7/2011 | Arai .................. H01L 23/49894 257/532 |
| 2011/0204505 A1 | 8/2011 | Pagaila et al. |
| 2011/0259631 A1 | 10/2011 | Rumsby |
| 2011/0291293 A1 | 12/2011 | Tuominen et al. |
| 2011/0304024 A1 | 12/2011 | Renna |
| 2011/0316147 A1* | 12/2011 | Shih ...................... H01L 23/147 257/737 |
| 2012/0128891 A1 | 5/2012 | Takei et al. |
| 2012/0146209 A1* | 6/2012 | Hu .......................... H01L 24/19 257/692 |
| 2012/0164827 A1 | 6/2012 | Rajagopalan et al. |
| 2012/0261805 A1 | 10/2012 | Sundaram et al. |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0203190 A1 | 8/2013 | Reed et al. |
| 2013/0286615 A1 | 10/2013 | Inagaki et al. |
| 2013/0341738 A1 | 12/2013 | Reinmuth et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0228416 A1 | 8/2015 | Hurwitz et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118337 A1 | 4/2016 | Yoon et al. |
| 2016/0172290 A1* | 6/2016 | Audet ................ H01L 23/49827 361/783 |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0223842 A1 | 8/2017 | Chujo et al. |
| 2017/0229432 A1 | 8/2017 | Lin et al. |
| 2017/0250141 A1* | 8/2017 | Imayoshi ................ H01L 24/16 |
| 2017/0338254 A1 | 11/2017 | Reit et al. |
| 2018/0019197 A1 | 1/2018 | Boyapati et al. |
| 2018/0116057 A1 | 4/2018 | Kajihara et al. |
| 2018/0182727 A1 | 6/2018 | Yu |

(56) References Cited

U.S. PATENT DOCUMENTS

| | | |
|---|---|---|
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1* | 8/2019 | England ............. H01L 24/89 |
| 2019/0285981 A1 | 9/2019 | Cunningham et al. |
| 2019/0306988 A1 | 10/2019 | Grober et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0039002 A1 | 2/2020 | Sercel et al. |
| 2020/0130131 A1 | 4/2020 | Togawa et al. |
| 2020/0357947 A1 | 11/2020 | Chen et al. |
| 2020/0358163 A1 | 11/2020 | See et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |
| CN | 100561696 C | 11/2009 |
| CN | 104637912 A | 5/2015 |
| CN | 105436718 A | 3/2016 |
| CN | 106531647 A | 3/2017 |
| CN | 106653703 A | 5/2017 |
| CN | 108028225 A | 5/2018 |
| CN | 111492472 A | 8/2020 |
| EP | 0264134 A2 | 4/1988 |
| EP | 1536673 A1 | 6/2005 |
| EP | 1478021 B1 | 7/2008 |
| EP | 1845762 B1 | 5/2011 |
| EP | 2942808 A1 | 11/2015 |
| JP | 2001244591 A | 9/2001 |
| JP | 2002246755 A | 8/2002 |
| JP | 2003188340 A | 7/2003 |
| JP | 2004311788 A | 11/2004 |
| JP | 2004335641 A | 11/2004 |
| JP | 4108285 B2 | 6/2008 |
| JP | 2012069926 A | 4/2012 |
| JP | 5004378 B2 | 8/2012 |
| JP | 5111342 B2 | 1/2013 |
| JP | 5693977 B2 | 4/2015 |
| JP | 5700241 B2 | 4/2015 |
| JP | 5981232 B2 | 8/2016 |
| JP | 6394136 B2 | 9/2018 |
| JP | 6542616 B2 | 7/2019 |
| JP | 6626697 B2 | 12/2019 |
| KR | 100714196 B1 | 5/2007 |
| KR | 100731112 B1 | 6/2007 |
| KR | 10-2008-0037296 A | 4/2008 |
| KR | 2008052491 A | 6/2008 |
| KR | 20100097893 A | 9/2010 |
| KR | 101301507 B1 | 9/2013 |
| KR | 20140086375 A | 7/2014 |
| KR | 101494413 B1 | 2/2015 |
| KR | 20160013706 A | 2/2016 |
| KR | 20180113885 A | 10/2018 |
| KR | 101922884 B1 | 11/2018 |
| KR | 101975302 B1 | 8/2019 |
| KR | 102012443 B1 | 8/2019 |
| TW | I594397 B | 8/2017 |
| WO | 2011130300 A1 | 10/2011 |
| WO | 2013008415 A1 | 1/2013 |
| WO | 2013126927 A2 | 8/2013 |
| WO | 2015126438 A1 | 8/2015 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |
| WO | 2019/177742 A1 | 9/2019 |

OTHER PUBLICATIONS

Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.

Tecnisco, Ltd.—"Company Profile" presentation with product introduction, date unknown, 26 pages.

Wang et al. "Study of Direct Cu Electrodeposition on Ultra-Thin Mo for Copper Interconnect", State key lab of ASIC and system, School of microelectronics, Fudan University, Shanghai, China; 36 pages.

International Search Report and Written Opinion dated Oct. 7, 2021 for Application No. PCT/US2021037375.

PCT International Search Report and Written Opinion dated Oct. 19, 2021, for International Application No. PCT/US2021/038690.

Allresist Gmbh—Strausberg et al: "Resist-Wiki: Adhesion promoter HMDS and diphenylsilanedio (AR 300-80) -. . . —ALLRESIST GmbH—Strausberg, Germany", Apr. 12, 2019 (Apr. 12, 2019), XP055663206, Retrieved from the Internet: URL:https://web.archive.org/web/20190412209micals-adhesion-promoter-hmds-and-diphenyl2908/https://www.allresist.com/process-chemicals-adhesion-promoter-hmds-and-diphenylsilanedio/, [retrieved on Jan. 29, 2020].

Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).

Arifur Rahman. "System-Level Performance Evaluation of Three-Dimensional Integrated Circuits", vol. 8, No. 6, Dec. 2000. pp. 671-678.

Baier, T. et al., Theoretical Approach to Estimate Laser Process Parameters for Drilling in Crystalline Silicon, Prog. Photovolt: Res. Appl. 18 (2010) 603-606, 5 pages.

Chien-Wei Chien et al. "Chip Embedded Wafer Level Packaging Technology for Stacked RF-SiP Application",2007 IEEE, pp. 305-310.

Chien-Wei Chien et al. "3D Chip Stack With Wafer Through Hole Technology". 6 pages.

Doany, F.E., et al.—"Laser release process to obtain freestanding multilayer metal-polyimide circuits," IBM Journal of Research and Development, vol. 41, Issue 1/2, Jan./Mar. 1997, pp. 151-157.

Dyer, P.E., et al.—"Nanosecond photoacoustic studies on ultraviolet laser ablation of organic polymers," Applied Physics Letters, vol. 48, No. 6, Feb. 10, 1986, pp. 445-447.

Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].

Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179 ].

Han, Younggun, et al.—"Evaluation of Residual Stress and Warpage of Device Embedded Substrates with Piezo-Resistive Sensor Silicon Chips" technical paper, Jul. 31, 2015, pp. 81-94.

International Search Report and the Written Opinion for International Application No. PCT/US2019/064280 dated Mar. 20, 2020, 12 pages.

International Search Report and Written Opinion for Application No. PCT/US2020/026832 dated Jul. 23, 2020.

Italian search report and written opinion for Application No. IT 201900006736 dated Mar. 2, 2020.

Italian Search Report and Written Opinion for Application No. IT 201900006740 dated Mar. 4, 2020.

(56) References Cited

OTHER PUBLICATIONS

Junghoon Yeom', et al. "Critical Aspect Ratio Dependence in Deep Reactive Ion Etching of Silicon", 2003 IEEE. pp. 1631-1634.

K. Sakuma et al. "3D Stacking Technology with Low-Volume Lead-Free Interconnections", IBM T.J. Watson Research Center. 2007 IEEE, pp. 627-632.

Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.

Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.

Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.

Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.

Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.

L. Wang, et al. "High aspect ratio through-wafer interconnections for 3Dmicrosystems", 2003 IEEE. pp. 634-637.

Lee et al. "Effect of sputtering parameters on the adhesion force of copper/molybdenum metal on polymer substrate," 2011, Current Applied Physics, vol. 11, pp S12-S15, doi: 10.1016/j.cap.2011.06.019.

Liu, C.Y. et al., Time Resolved Shadowgraph Images of Silicon during Laser Ablation: Shockwaves and Particle Seneration, Journal of Physics: Conference Series 59 (2007) 338-342, 6 pages.

Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.

NT Nguyen et al. "Through-Wafer Copper Electroplating for Three-Dimensional Interconnects", Journal of Micromechanics and Microengineering. 12 (2002) 395-399. 2002 IOP.

PCT International Search Report and Written Opinion dated Aug. 28, 2020, for International Application No. PCT/US2020/032245.

PCT International Search Report and Written Opinion dated Feb. 17, 2021 for International Application No. PCT/US2020/057787.

PCT International Search Report and Written Opinion dated Feb. 19, 2021, for International Application No. PCT/US2020/057788.

PCT International Search Report and Written Opinion dated Sep. 15, 2020, for International Application No. PCT/US2020/035778.

Ronald Hon et al. "Multi-Stack Flip Chip 3D Packaging with Copper Plated Through-Silicon Vertical Interconnection", 2005 IEEE. pp. 384-389.

S. W. Ricky Lee et al. "3D Stacked Flip Chip Packaging with Through Silicon Vias and Copper Plating or Conductive Adhesive Filling", 2005 IEEE, pp. 798-801.

Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.

Shi, Tailong, et al.—"First Demonstration of Panel Glass Fan-out (GFO) Packages for High I/O Density and High Frequency Multichip Integration," Proceedings of 2017 IEEE 67th Electronic Components and Technology Conference, May 30-Jun. 2, 2017, pp. 41-46.

Srinivasan, R., et al.—"Ultraviolet Laser Ablation of Organic Polymers," Chemical Reviews, 1989, vol. 89, No. 6, pp. 1303-1316.

Taiwan Office Action dated Oct. 27, 2020 for Application No. 108148588.

Trusheim, D. et al., Investigation of the Influence of Pulse Duration in Laser Processes for Solar Cells, Physics Procedia Dec. 2011, 278-285, 9 pages.

Wu et al., Microelect. Eng., vol. 87 2010, pp. 505-509.

Yu et al. "High Performance, High Density RDL for Advanced Packaging," 2018 IEEE 68th Electronic Components and Technology Conference, pp. 587-593, DOI 10.1109/ETCC.2018.0009.

Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.

PCT International Search Report and Written Opinion dated Feb. 4, 2022, for International Application No. PCT/US2021/053830.

PCT International Search Report and Written Opinion dated Feb. 4, 2022, for International Application No. PCT/US2021/053821.

Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.

Malta, D., et al.—"Fabrication of TSV-Based Silicon Interposers," 3D Systems Integration Conference (3DIC), 2010 IEEE International, Nov. 16-18, 2010, 6 pages.

\* cited by examiner

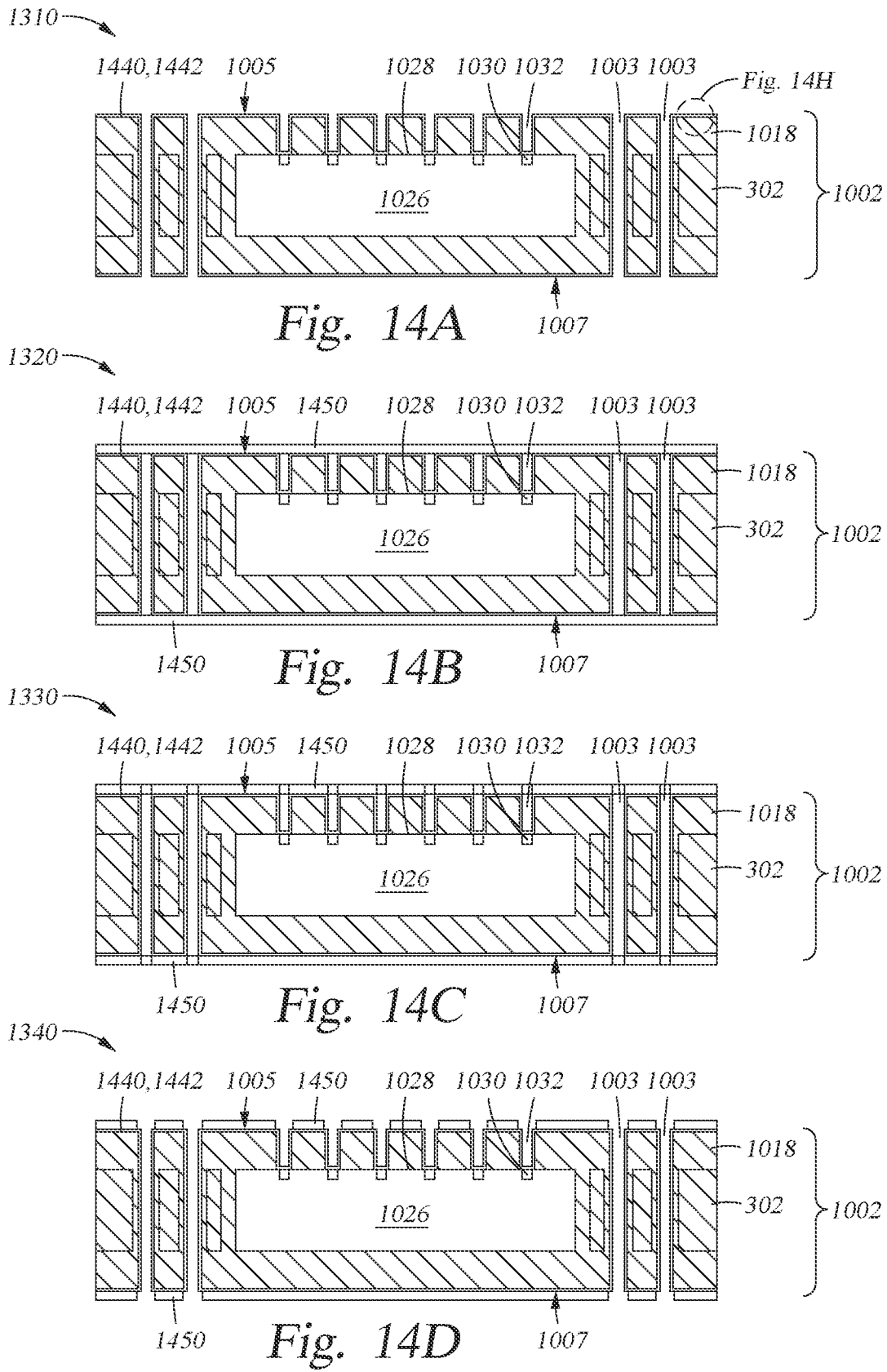

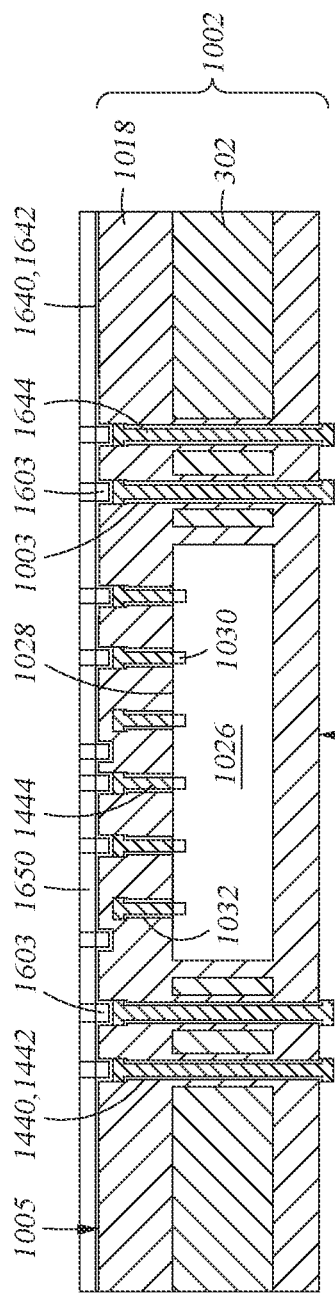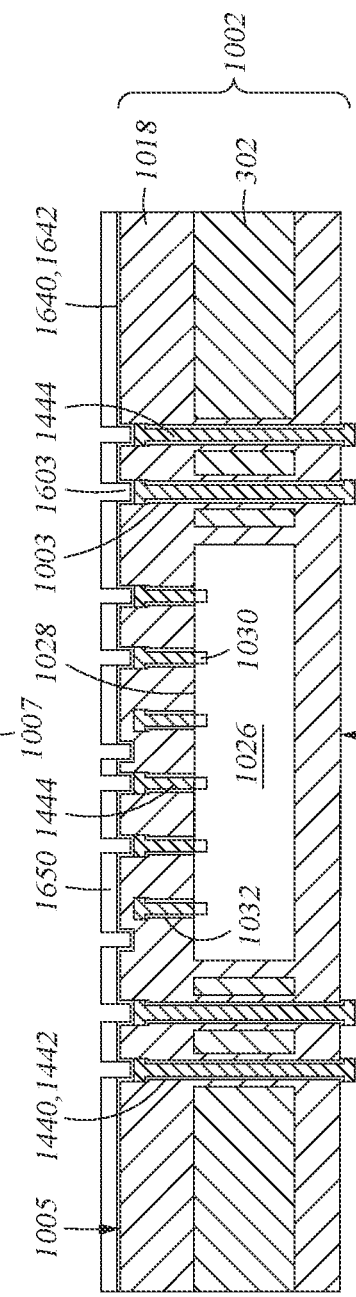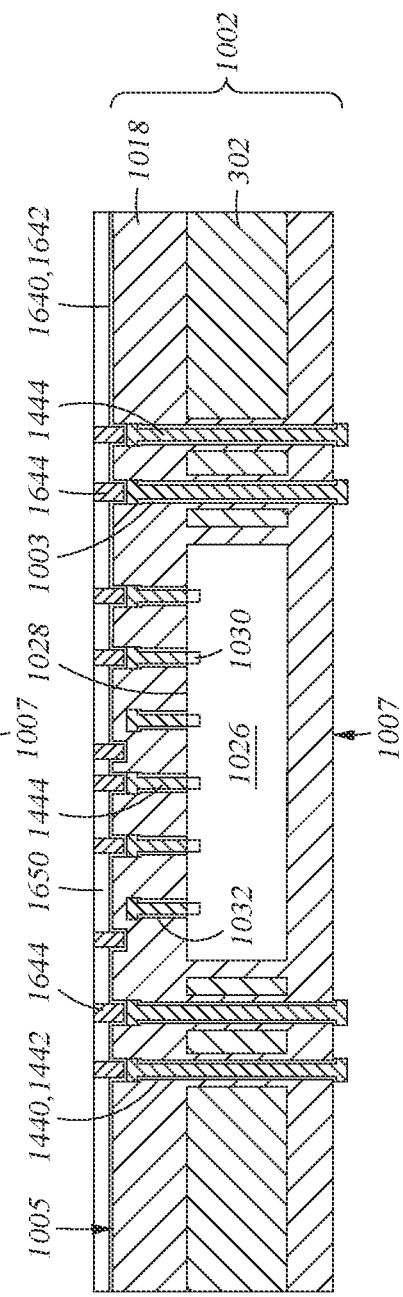
Fig. 16F
Fig. 16G
Fig. 16H

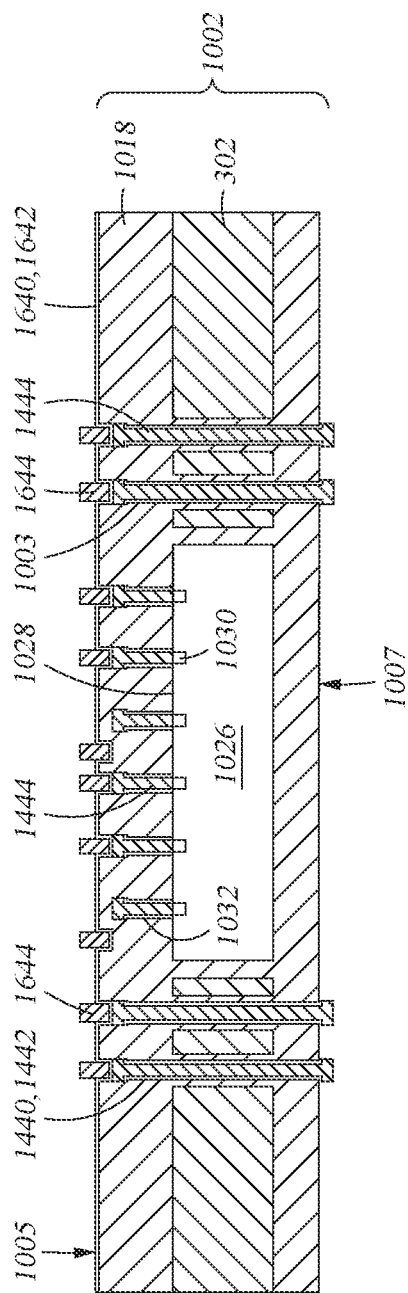
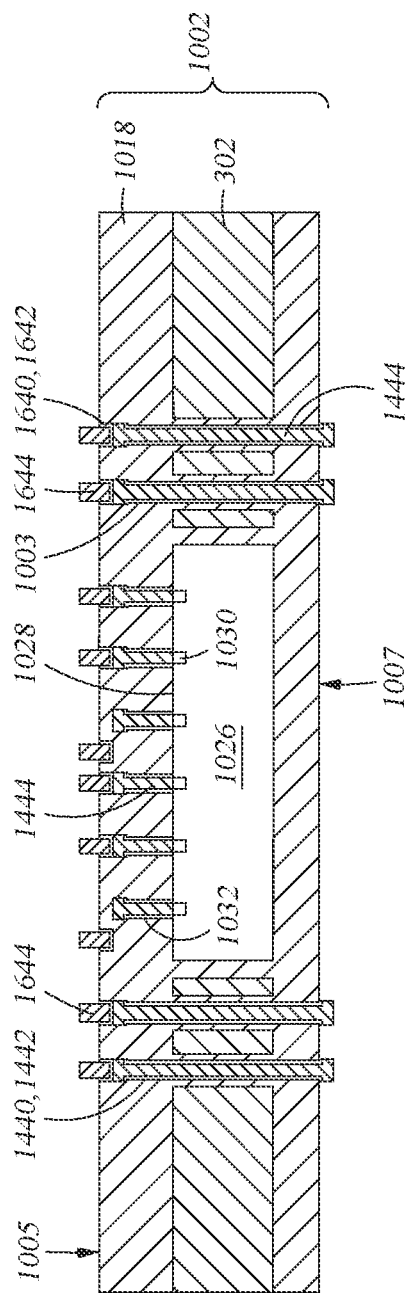
Fig. 16I
Fig. 16J

PACKAGE STRUCTURE AND FABRICATION METHODS

CROSS-REFERENCE TO RELATED APPLICATIONS

This application is a continuation of U.S. patent application Ser. No. 16/687,567 filed Nov. 18, 2019, which claims priority to Italian patent application number 102019000006736, filed May 10, 2019, each of which is herein incorporated by reference in its entirety.

BACKGROUND

Field

Embodiments of the present disclosure generally relate to semiconductor package structures and methods of forming the same. More specifically, embodiments described herein relate to structures of thin-form-factor semiconductor packages and methods of forming the same.

Description of the Related Art

Due to an ever-increasing demand for miniaturized electronic devices and components, integrated circuits have evolved into complex 2.5D and 3D devices that can include millions of transistors, capacitors, and resistors on a single chip. The evolution of chip design has resulted in greater circuit density to improve the process capability and speed of integrated circuits. The demand for faster processing capabilities with greater circuit densities imposes corresponding demands on the materials, structures, and processes used in the fabrication of integrated circuit packages. Alongside these trends toward greater integration and performance, however, there exists the perpetual pursuit for reduced manufacturing costs.

Conventionally, integrated circuit packages have been fabricated on organic package substrates due to the ease of forming features and connections therein, as well as the relatively low package manufacturing costs associated with organic composites. However, as circuit densities are increased and electronic devices are further miniaturized, the utilization of organic package substrates becomes impractical due to limitations with material structuring resolution to sustain device scaling and associated performance requirements. More recently, 2.5D and/or 3D integrated circuit packages have been fabricated utilizing passive silicon interposers placed on organic package substrates as redistribution layers to compensate for some of the limitations associated with organic package substrates. Silicon interposer utilization is driven by the potential for high-bandwidth density, lower-power chip-to-chip communication, and heterogeneous integration requirements in advanced packaging applications. Yet, the formation of features in silicon interposers, such as through-silicon vias (TSVs), is still difficult and costly. In particular, high costs are imposed by high-aspect-ratio silicon via etching, chemical mechanical planarization, and semiconductor back end of line (BEOL) interconnection.

Therefore, what is needed in the art are improved semiconductor package structures for advanced packaging applications and methods of forming the same.

SUMMARY

In one embodiment, a package assembly is provided. The package assembly includes a silicon frame having a first surface opposite a second surface and at least one cavity with a semiconductor die disposed therein. The frame further includes a via having a via surface defining an opening that extends through the frame from the first surface to the second surface. An insulating layer is formed over the first surface and the second surface and contacts at least a portion of each side of the semiconductor die. An electrical connection is disposed within the via, and the insulating layer is disposed between the electrical interconnection and the via surface.

In one embodiment, a package assembly is provided. The package assembly includes an embedded die assembly having a frame that comprises silicon, an oxide layer disposed over surfaces of the frame, and one or more semiconductor dies disposed within the frame and having an integrated circuit formed thereon. An insulating layer is formed on the oxide layer and includes an epoxy resin material having ceramic particles disposed therein. The package assembly further includes one or more metal interconnections disposed within a portion of the embedded die assembly. In some configurations, the oxide layer is disposed over all exposed surfaces of the frame, and thus surrounds the frame.

In one embodiment, a package assembly is provided. The package assembly includes an embedded die assembly having a frame that comprises silicon, one or more semiconductor dies disposed within the frame, a first insulating layer formed on the frame, and one or more electrical interconnections disposed through the frame or the first insulating layer. The first insulating layer is formed of an epoxy resin material having ceramic particles. A redistribution layer is further formed on the embedded die assembly and includes a second insulating layer formed on the first insulating layer and one or more electrical redistribution connections disposed therethrough.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 14A-14H schematically illustrate cross-sectional views of the embedded die assembly at different stages of the interconnection formation process depicted in FIG. 13.

FIGS. 16A-16L schematically illustrate cross-sectional views of an embedded die assembly at different stages of forming a redistribution layer followed by package singulation, as depicted in FIG. 15.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods and apparatus for forming a thin-form-factor semiconductor package. In one embodiment, a substrate is structured, or shaped, by micro-blasting to enable formation of interconnections therethrough. In another embodiment, a substrate is structured by direct laser patterning. The substrate is thereafter utilized as a package frame for forming one or more semiconductor packages with dies disposed therein. In still other embodiments, the substrate is utilized as a frame for a semiconductor device stack, such as a dynamic random-access memory (DRAM) stack.

The methods and apparatus disclosed herein further include novel thin-form-factor semiconductor package structures intended to replace more conventional package structures utilizing glass fiber-filled epoxy frames and silicon interposers as redistribution layers. Generally, the scalability of current packages is limited by the rigidity and planarity of the materials utilized to form the various package structures (e.g., epoxy molding compound, FR-4 and FR-5 grade woven fiberglass cloth with epoxy resin binders, and the like). The intrinsic properties of these materials cause difficulty in patterning fine (e.g., less than 50 μm) features therein. Furthermore, as a result of the thermal properties of current package materials, coefficient of thermal expansion (CTE) mismatch may occur between the packaging substrate, the molding compound, and any semiconductor dies integrated therein and thus, current package structures necessitate larger solder bumps with greater spacing to mitigate any warpage caused by the CTE mismatch. Accordingly, conventional package structures are characterized by low die-to-package area ratios and low through-package bandwidths, resulting in decreased overall power efficiency. The methods and apparatus disclosed herein provide semiconductor package structures that overcome many of the disadvantages associated with conventional package structures described above.

Figure 1:
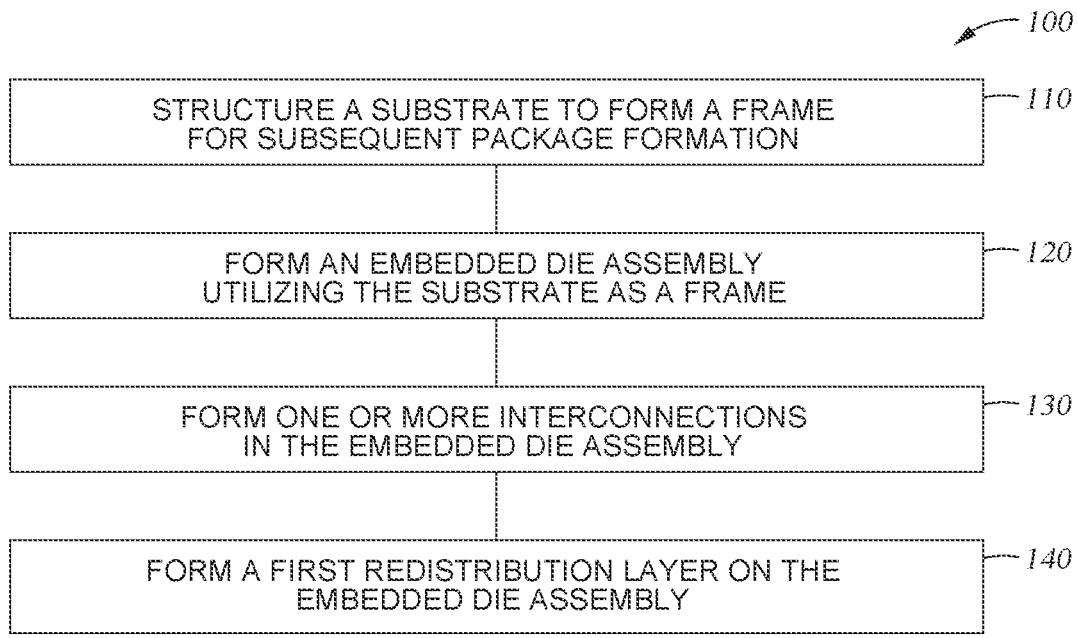
FIG. 1 illustrates a flow diagram of a process for forming a semiconductor package, according to an embodiment described herein.

FIG. 1 illustrates a flow diagram of a representative method 100 of forming a thin-form-factor semiconductor package. The method 100 has multiple operations 110, 120, 130, and 140. Each operation is described in greater detail with reference to FIGS. 2-16L. The method may include one or more additional operations which are carried out before any of the defined operations, between two of the defined operations, or after all of the defined operations (except where the context excludes the possibility).

In general, the method 100 includes structuring a substrate to be used as a package frame at operation 110, further described in greater detail with reference to FIGS. 2, 3A-3D, 4A-4F, 5A-5F, 6A-6E, 7A-7D, and 8. At operation 120, an embedded die assembly having one or more embedded dies and an insulating layer is formed, which is described in greater detail with reference to FIGS. 9 and 10A-10K, and FIGS. 11 and 12A-12G. At operation 130, one or more interconnections are formed in and/or through the embedded die assembly for interconnection of embedded die-frame sets, which is described in greater detail with reference to FIGS. 13 and 14A-14H. At operation 140, a first redistribution layer is formed on the embedded die assembly to relocate contact points of the interconnections to desired lateral locations on the embedded die assembly surface. In some embodiments, one or more additional redistribution layers may be formed in addition to the first redistribution layer before individual packages are singulated from the embedded die assembly, which is described in greater detail with reference to FIGS. 15 and 16A-16L.

Figure 2:
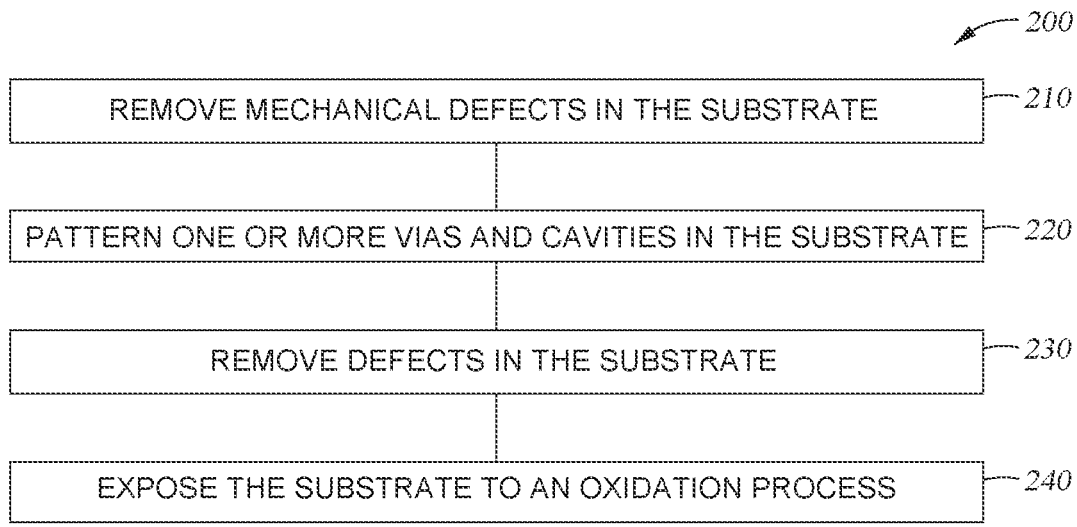
FIG. 2 illustrates a flow diagram of a process for substrate structuring for forming a semiconductor package, according to an embodiment described herein.

FIG. 2 illustrates a flow diagram of a representative method 200 for structuring a substrate to be utilized as a frame during the formation of a semiconductor package. FIGS. 3A-3D schematically illustrate cross-sectional views of a substrate 302 at different stages of the substrate structuring process 200 represented in FIG. 2. Therefore, FIG. 2 and FIGS. 3A-3D are herein described together for clarity.

Figure 3A:
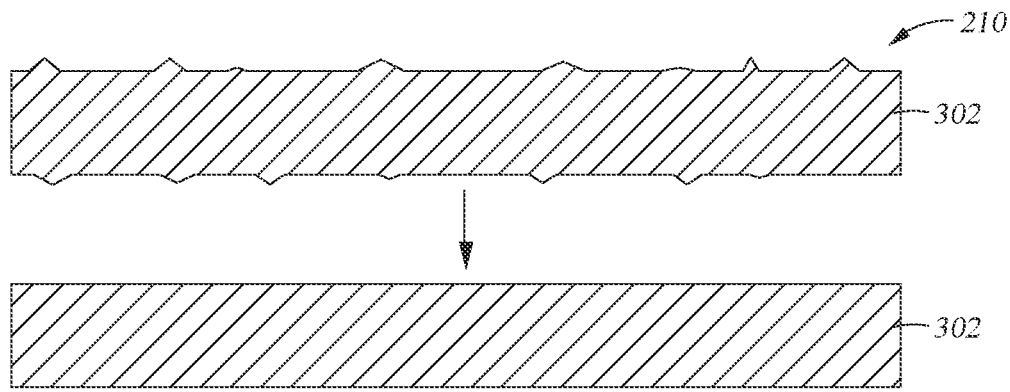
FIGS. 3A-3D schematically illustrate cross-sectional views of a substrate at different stages of the substrate structuring process depicted in FIG. 2.

The method 200 begins at operation 210 and corresponding FIG. 3A. The substrate 302 is formed of any suitable frame material including but not limited to a III-V compound semiconductor material, silicon, crystalline silicon (e.g., Si<100> or Si<111>), silicon oxide, silicon germanium, doped or undoped silicon, doped or undoped polysilicon, silicon nitride, quartz, borosilicate glass, glass, sapphire, alumina, and ceramic. In one embodiment, the substrate 302 is a monocrystalline p-type or n-type silicon substrate. In one embodiment, the substrate 302 is a polycrystalline p-type or n-type silicon substrate. In another embodiment, the substrate 302 is a p-type or n-type silicon solar substrate. The substrate 302 may further have a polygonal or circular shape. For example, the substrate 302 may include a substantially square silicon substrate having lateral dimensions between about 120 mm and about 180 mm, with or without chamfered edges. In another example, the substrate 302 may include a circular silicon-containing wafer having a diameter between about 20 mm and about 700 mm, such as between about 100 mm and about 500 mm, for example about 300 mm.

Unless otherwise noted, embodiments and examples described herein are conducted on substrates having a thickness between about 50 µm and about 1000 µm, such as between about 90 µm and about 780 µm. For example, the substrate 302 has a thickness between about 100 µm and about 300 µm, such as a thickness between about 110 µm and about 200 µm. In another example, the substrate 302 has a thickness between about 60 µm and about 160 µm, such as a thickness between about 80 µm and about 120 µm.

Prior to operation 210, the substrate 302 may be sliced and separated from a bulk material by wire sawing, scribing and breaking, mechanical abrasive sawing, or laser cutting. Slicing typically causes mechanical defects or deformities in substrate surfaces formed therefrom, such as scratches, micro-cracking, chipping, and other mechanical defects. Thus, the substrate 302 is exposed to a first damage removal process at operation 210 to smoothen and planarize surfaces thereof and remove any mechanical defects in preparation for later structuring and packaging operations. In some embodiments, the substrate 302 may further be thinned by adjusting the process parameters of the first damage removal process. For example, a thickness of the substrate 302 may be decreased with increased exposure to the first damage removal process.

The damage removal process at operation 210 includes exposing the substrate 302 to a substrate polishing process and/or an etch process followed by rinsing and drying processes. In some embodiments, operation 210 includes a chemical mechanical polishing (CMP) process. In one embodiment, the etch process is a wet etch process including a buffered etch process that is selective for the removal of desired materials (e.g., contaminants and other undesirable compounds). In other embodiments, the etch process is a wet etch process utilizing an isotropic aqueous etch process. Any suitable wet etchant or combination of wet etchants may be used for the wet etch process. In one embodiment, the substrate 302 is immersed in an aqueous HF etching solution for etching. In another embodiment, the substrate 302 is immersed in an aqueous KOH etching solution for etching.

In some embodiments, the etching solution is heated to a temperature between about 30° C. and about 100° C. during the etch process, such as between about 40° C. and about 90° C. For example, the etching solution is heated to a temperature of about 70° C. In still other embodiments, the etch process at operation 210 is a dry etch process. An example of a dry etch process includes a plasma-based dry etch process. The thickness of the substrate 302 is modulated by controlling the time of exposure of the substrate 302 to the etchants (e.g., the etching solution) used during the etch process. For example, a final thickness of the substrate 302 is reduced with increased exposure to the etchants. Alternatively, the substrate 302 may have a greater final thickness with decreased exposure to the etchants.

Figure 3B:
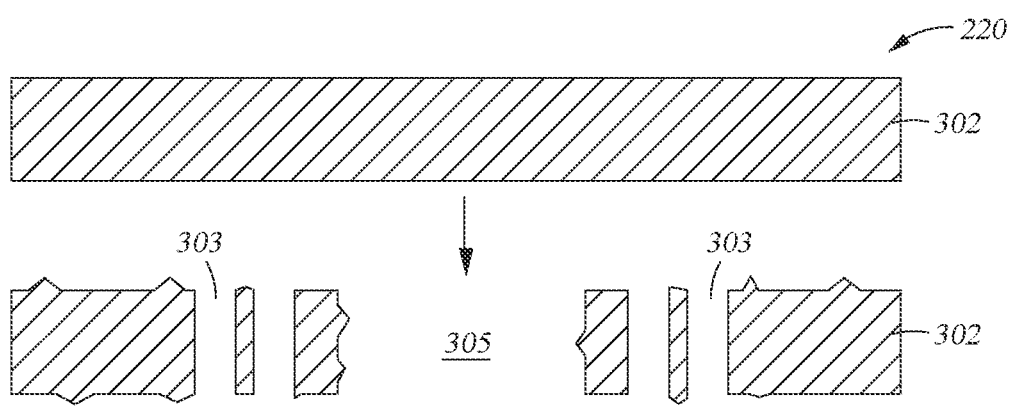
Figure 3C:
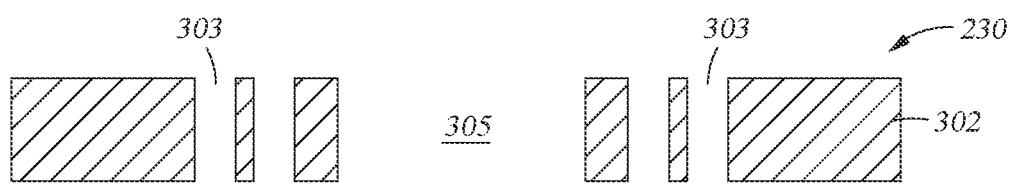
Figure 3D:
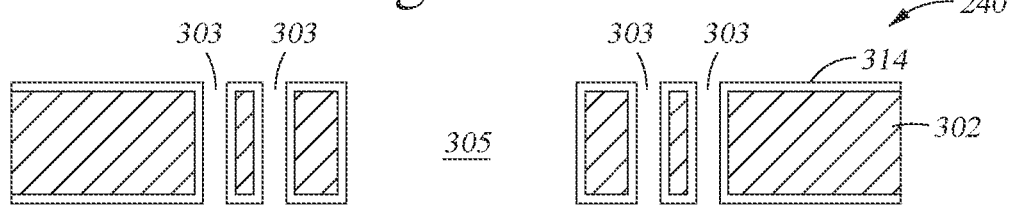

At operations 220 and 230, the now planarized and substantially defect-free substrate 302 has one or more features, such as vias 303 and cavities 305, patterned therein and smoothened (one cavity 305 and four vias 303 are depicted in the lower cross-section of the substrate 302 in FIG. 3B). The vias 303 are utilized to form direct contact electrical interconnections through the substrate 302 and the cavities 305 are utilized to receive and enclose (i.e., embed) one or more semiconductor dies therein. FIGS. 4A-4C, 5A-5C, 6A-6C, and 7A-7B illustrate cross-sectional views of the substrate 302 at different stages of the feature formation and damage or defect removal (e.g., smoothening) processes according to embodiments described herein. Thus, operations 220 and 230 will now be described in greater detail with reference to FIGS. 4A-4C, 5A-5C, 6A-6C, and 7A-7B.

Figure 4A:
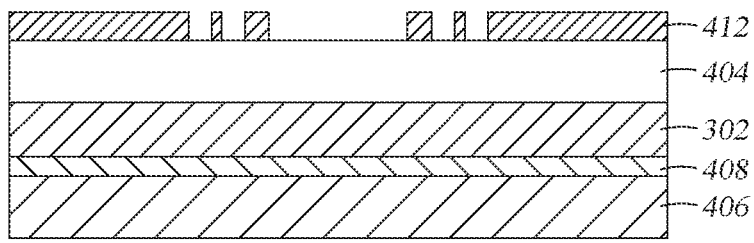
FIGS. 4A-4F schematically illustrate cross-sectional views of a substrate at different stages of feature formation and subsequent damage removal, according to an embodiment described herein.
Figure 5A:
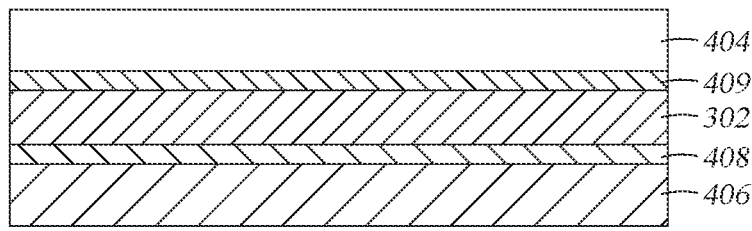
FIGS. 5A-5F schematically illustrate cross-sectional views of a substrate at different stages of feature formation and subsequent damage removal, according to an embodiment described herein.

In embodiments where the substrate 302 has a thickness less than about 200 µm, such as a thickness of about 100 µm, or a thickness of about 50 µm, the substrate 302 may first be coupled to an optional carrier plate 406 as depicted in FIGS. 4A and 5A. The carrier plate 406 provides mechanical support for the substrate 302 during the substrate structuring process 200 and prevents the substrate 302 from breaking. The carrier plate 406 is formed of any suitable chemically and thermally stable rigid material including but not limited to glass, ceramic, metal, or the like. The carrier plate 406 has a thickness between about 1 mm and about 10 mm, such as between about 2 mm and about 5 mm. In one embodiment, the carrier plate 406 has a textured surface. In other embodiments, the carrier plate 406 has a polished or smoothened surface.

The substrate 302 may be coupled to the carrier plate 406 via an adhesive layer 408. The adhesive layer 408 is formed of any suitable temporary bonding material, including but not limited to wax, glue, or similar bonding material. The adhesive layer 408 is applied onto the carrier plate 406 by mechanical rolling, pressing, lamination, spin coating, or doctor-blading. In one embodiment, the adhesive layer 408 is a water-soluble or solvent-soluble adhesive layer. In other embodiments, the adhesive layer 408 is a UV release adhesive layer. In still other embodiments, the adhesive layer 408 is a thermal release adhesive layer. In such embodiments, the bonding properties of the adhesive layer 408 degrade upon exposure to heat treatment, for example, by exposing the adhesive layer 408 to temperatures above 110° C., such as above 150° C. The adhesive layer 408 may further include one or more layers of additional films (not shown), such as a liner, a base film, a pressure-sensitive film, and other suitable layers.

In some embodiments, after bonding of the substrate 302 to the carrier plate 406, a resist film is applied to the substrate 302 to form a resist layer 404, depicted in FIGS. 4A and 5A. In embodiments where the substrate 302 has a thickness of greater than about 200 µm, such as a thickness of about 250 µm, the resist layer 404 is formed on the substrate 302 without first coupling the substrate 302 to the carrier plate 406. The resist layer 404 is used to transfer a desired pattern to the substrate 302 upon which the resist layer 404 is formed during subsequent processing operations. After being patterned, the resist layer 404 protects selected regions of the underlying substrate 302 during later structuring operations.

The substrate 302 generally has a substantially planar surface upon which the resist layer 404 is formed. In some embodiments, such as those illustrated in FIG. 5A, the resist layer 404 is bonded to the substrate 302 via a resist adhesive layer 409. The resist adhesive layer 409 is formed of any suitable temporary bonding material, including but not limited to polyvinyl alcohol, triester with 2-ethyl-2-(hydroxymethyl)-1,3-propanediol, and other water- or solvent-soluble materials. In one embodiment, the resist adhesive layer 409 is formed of a different material than the adhesive layer 408.

In one embodiment, the resist adhesive layer 409 is substantially similar in composition to the adhesive layer 408. The resist adhesive layer 409 is applied onto the substrate 302 by mechanical rolling, pressing, lamination, spin coating, or doctor-blading. In other embodiments, the resist layer 404 is formed of a temporary bonding material such as polyvinyl alcohol, thus enabling the resist layer 404 to be directly applied and bonded to the surface of the substrate 302. The resist layer 404 may include one or more layers, for example, a first resist layer and a second resist layer (not shown).

In one embodiment, such as the embodiment illustrated in FIG. 4A, the resist layer 404 is a photosensitive layer (e.g., photoresist). The resist layer 404 may include a solvent, a photoresist resin, and a photoacid generator. The photoresist resin may be any positive photoresist resin or any negative photoresist resin. Representative photoresist resins include acrylates, novolak resins, poly(methylmethacrylates), and poly(olefin sulfones). Other photoresist resins may also be used. Upon exposure to electromagnetic radiation, the photoacid generator generates charged species, such as acid cations and anions. The photoacid generator may also generate polarized species. The photoacid generator sensitizes the resin to electromagnetic radiation. Representative photoacid generators include sulfonate compounds, such as, for example, sulfonated salts, sulfonated esters, and sulfonyloxy ketones. Other suitable photoacid generators include onium salts, such as aryl-diazonium salts, halonium salts, aromatic sulfonium salts and sulfoxonium salts or selenium salts. Other representative photoacid generators include nitrobenzyl esters, s-triazine derivatives, ionic iodonium sulfonates, perfluoroalkanesulfonates, aryl triflates and derivatives and analogs thereof, pyrogallol derivatives, and alkyl disulfones. Other photoacid generators may also be used. In one embodiment, such as the embodiment illustrated in FIG. 5A, the resist layer 404 is a laser-sensitive resist.

Figure 4B:
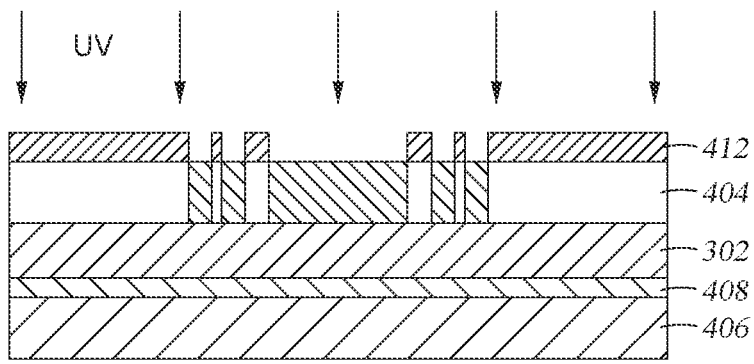
Figure 5B:
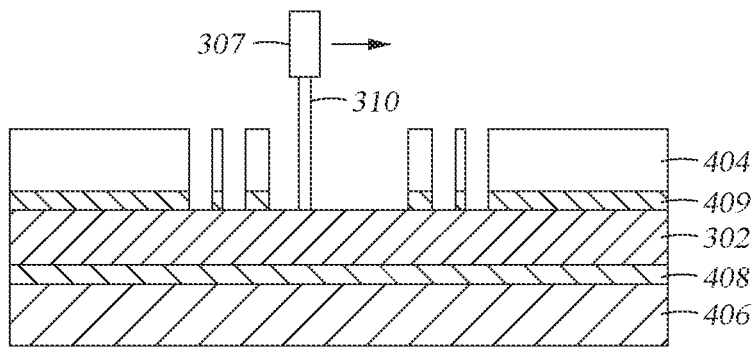

After formation of the resist layer 404, the substrate 302 having the resist layer 404 formed thereon is exposed to electromagnetic radiation to pattern the resist layer 404, depicted in FIGS. 4B and 5B. In the embodiment illustrated by FIG. 4B, the substrate 302 having the resist layer 404 formed thereon is exposed to electromagnetic radiation in the ultraviolet (UV) range. Portions of the resist layer 404 are selectively exposed and portions of the resist layer 404 are selectively unexposed to the UV radiation. Upon exposure to the UV radiation, the selectively exposed portions of the resist layer 404 are structurally weakened (illustrated by hatching) while the selectively unexposed portions maintain their structural integrity. In one embodiment, a mask 412 having a desired pattern is formed on or adjacent to the photosensitive resist layer 404 prior to UV radiation exposure. In other embodiments, the mask 412 is a reticle positioned between the resist layer 404 and the UV radiation source. The mask 412 is configured to transfer a desired pattern of UV radiation to the resist layer 404. The mask 412 is formed of any suitable polymeric material, including but not limited to PTFE, PVDF, FEP, polyimide, or the like.

In the embodiment illustrated by FIG. 5B, the substrate 302 having the laser-sensitive resist layer 404 formed thereon is exposed to electromagnetic radiation generated by a laser source 307 instead of a UV radiation source. As such, patterning is accomplished by targeted laser ablation, without the use of a mask. The laser source 307 may be any suitable type of laser for patterning of the resist layer 404. In some examples, the laser source 307 is a femtosecond green laser. In other examples, the laser source 307 is a femtosecond UV laser. The laser source 307 generates a continuous or pulsed laser beam 310 for patterning of the resist layer 404. For example, the laser source 307 may generate a pulsed laser beam 310 having a frequency between 100 kHz and 1200 kHz, such as between about 200 kHz and about 1000 kHz. The laser source 307 is generally configured to form any desired pattern in the resist layer 404. It is further contemplated that the electromagnetic radiation at operation may alternatively include an electron beam or an ion beam instead of a laser beam.

The resist layer 404 may be formed of any material having a suitable hardness after the resist layer 404 has been patterned, such as, for example, after exposing a negative photoresist to electromagnetic radiation to cause cross-linking of the material in the resist. In general, the resist layer 404 needs to have one or more desirable mechanical properties after the resist layer 404 has been patterned (e.g., deposited, exposed and developed). In one embodiment, the resist layer 404 is formed of a material having a Shore A scale hardness value of between 40 and 90, such as between 60 and 70 after patterning. For example, the resist layer 404 is formed of a material having a Shore A scale hardness value of about 65 after patterning. In one embodiment, the resist layer 404 is formed of a material having a tensile strength of between about 0.5 MPa and about 10 MPa, such as between about 1 MPa and about 8 MPa after patterning. For example, the resist layer 404 may be formed of a material having a tensile strength of about 7 MPa after patterning. In one embodiment, the resist layer 404 is formed of a polydimethylsiloxane material. In other embodiments, the resist layer 404 is formed of polyvinyl alcohol, triester with 2-ethyl-2-(hydroxymethyl)-1, 3-propanediol, or the like.

Figure 4C:
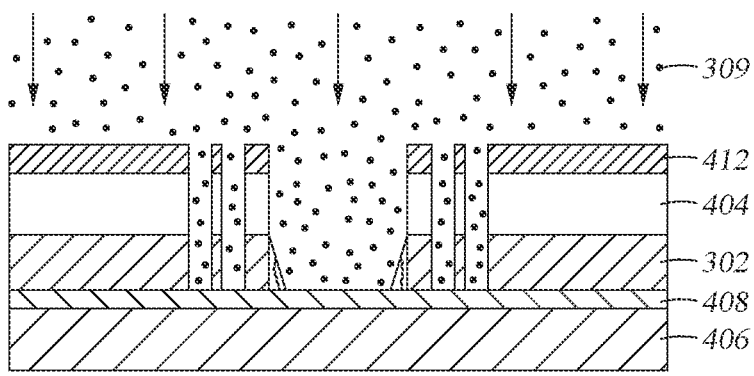
Figure 5C:
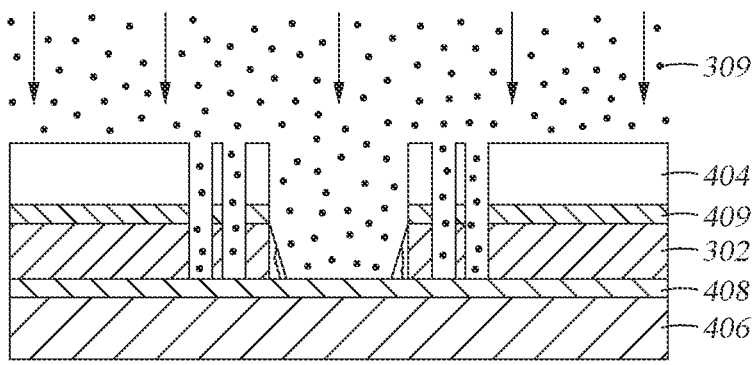

Following patterning of the resist layer 404, the substrate 302 having the resist layer 404 formed thereon is micro-blasted to form a desired pattern in the substrate 302 as depicted in FIGS. 4C and 5C. During the micro-blasting process, a stream of powder particles 309 is propelled toward the substrate 302 by use of a high-pressure carrier gas to dislodge exposed portions of the substrate 302 and/or layers formed thereon. The micro-blasting process is performed using any suitable substrate abrading system.

The micro-blasting process is determined by the material properties of the powder particles 309, the momentum of the powder particles that strike the exposed surface of the substrate 302 and the material properties of the substrate 302 along with, when applicable, the selectively-exposed portions of the resist layer 404. To achieve desired substrate patterning characteristics, adjustments are made to the type and size of the powder particles 309, the size and distance of the abrading system's applicator nozzle to the substrate 302, the pressure, which correlates to the velocity and flow rate, of the carrier gas utilized to propel the powder particles 309, and the density of the powder particles 309 in the fluid stream. For example, a desired fluid pressure of the carrier gas used for propelling the powder particles 309 toward the substrate 302 for a desired fixed micro-blasting device nozzle orifice size is determined based on the materials of the substrate 302 and the powder particles 309. In one embodiment, the fluid pressure utilized to micro-blast the substrate 302 ranges from between about 50 psi and about 150 psi, such as between about 75 psi and about 125 psi, to achieve a carrier gas and particle velocity of between about 300 and about 1000 meters per second (m/s) and/or a flow rate of between about 0.001 and about 0.002 cubic meters per second ($m^3/s$). For example, the fluid pressure of an inert gas (e.g., nitrogen (N2), CDA, argon) that is utilized to propel the powder particles 309 during micro-blasting is about 95 psi to achieve a carrier gas and particle velocity of about 2350 m/s. In one embodiment, the applicator nozzle utilized to micro-blast the substrate 302 has an inner diameter of between about 0.1 and about 2.5 millimeters (mm) that is disposed at a distance between about 1 mm and about 5 mm from the substrate 302, such as between about 2 mm and about 4 mm. For example, the applicator nozzle is disposed at a distance of about 3 mm from the substrate 302 during micro-blasting.

Generally, the micro-blasting process is performed with powder particles 309 having a sufficient hardness and high melting point to prevent particle adhesion upon contact with the substrate 302 and/or any layers formed thereon. For example, the micro-blasting process is performed utilizing powder particles 309 formed of a ceramic material. In one embodiment, the powder particles 309 utilized in the micro-blasting process are formed of aluminum oxide ($Al_2O_3$). In another embodiment, the powder particles 309 are formed of silicon carbide (SiC). Other suitable materials for the powder particles 309 are also contemplated. The powder particles 309 generally range in size between about 15 μm and about 60 μm in diameter, such as between about 20 μm and about 40 μm in diameter. For example, the powder particles 309 are an average particle size of about 27.5 μm in diameter. In another example, the powder particles 309 have an average particle size of about 23 μm in diameter.

The effectiveness of the micro-blasting process at operation 220 and depicted in FIGS. 4C and 5C further depends on the material characteristics of the resist layer 404. Utilizing a material having too high of a Shore A Scale hardness may cause unwanted ricocheting of the powder particles 309 between sidewalls of the resist layer 404, thus reducing the velocity upon which the powder particles 309 bombard the substrate 302, and ultimately reducing the effectiveness of the powder particles 309 in eroding or dislodging exposed regions of the substrate 302. Conversely, utilizing a material having too low of a Shore A Scale hardness may cause unwanted adhesion of the powder particles 309 to the resist layer 404. It is contemplated that a Shore A Scale hardness value of between about 40 and about 90 is utilized for the resist layer 404 material, as described above.

In embodiments where the resist layer 404 is a photoresist, such as the embodiment depicted in FIG. 4C, the substrate 302 remains unexposed at the start of the micro-blasting process. Thus, the powder particles 309 first bombard a surface of the photoresist, causing material from the UV-exposed and structurally weakened portions of the photoresist to be dislodged and removed. The powder particles 309 eventually penetrate through and remove the brittle UV-exposed portions to form voids in the resist layer 404, thus exposing desired regions of the substrate 302 while other regions remain shielded by the UV-unexposed portions of the photoresist. Micro-blasting is then continued until the powder particles 309 dislodge and remove a desired amount or depth of material from the exposed regions of the substrate 302, thus forming a desired pattern in the substrate 302. In embodiments where the resist layer 404 is patterned by laser ablation, such as the embodiment depicted in FIG. 5C, desired regions of the substrate 302 are already exposed through voids in the resist layer 404 prior to the micro-blasting process. Thus, minimal to no removal of the resist layer 404 is contemplated during micro-blasting.

The processes described above for forming features in the substrate 302 at operation 220 may cause unwanted mechanical defects on the surfaces of the substrate 302, such as chipping and cracking. Therefore, after performing operation 220 to form desired features in the substrate 302, the substrate 302 is exposed to a second damage removal and cleaning process at operation 230 to smoothen the surfaces of the substrate 302 and remove unwanted debris, followed by a stripping of the resist layer 404 and optional debonding of the substrate 302 from the carrier plate 406. FIGS. 4D-4F and 5D-5F illustrate cross-sectional views of the substrate 302 at different stages of the second damage removal, cleaning, resist stripping, and substrate debonding processes according to embodiments described herein. Thus, operation 230 will now be described in greater detail with reference to FIGS. 4D-4F and 5D-5F.

Figure 4D:
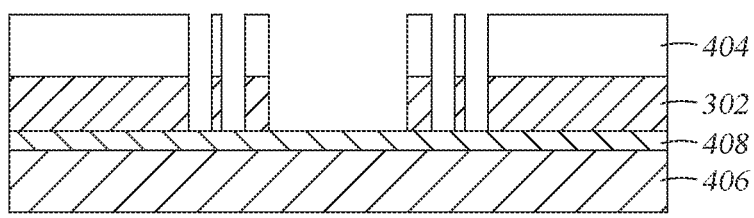
Figure 5D:
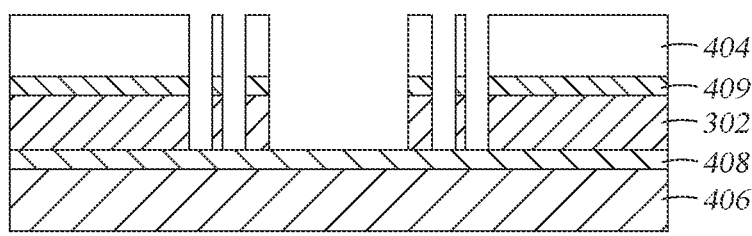

The second damage removal process at operation 230 is substantially similar to the first damage removal process at operation 210 and includes exposing the substrate 302 to an etch process, followed by rinsing and drying. The etch process proceeds for a predetermined duration to smoothen the surfaces of the substrate 302, and in particular, the surfaces exposed to the micro-blasting process. In another aspect, the etch process is utilized to remove undesired debris remaining from the micro-blasting process. Leftover powder particles adhering to the substrate 302 may be removed during the etch process. FIGS. 4D and 5D illustrate the substrate 302 after removal of debris and surface smoothening.

In one embodiment, the etch process is a wet etch process utilizing a buffered etch process preferentially etching the substrate surface versus the resist layer 404 material. For example, the buffered etch process is selective for polyvinyl alcohol. In other embodiments, the etch process is a wet etch process utilizing an aqueous etch process. Any suitable wet etchant or combination of wet etchants may be used for the wet etch process. In one embodiment, the substrate 302 is immersed in an aqueous HF etching solution for etching. In another embodiment, the substrate 302 is immersed in an aqueous KOH etching solution for etching. The etching solution may further be heated to a temperature between about 40° C. and about 80° C. during the etch process, such as between about 50° C. and about 70° C. For example, the etching solution is heated to a temperature of about 60° C. The etch process may be isotropic or anisotropic. In still other embodiments, the etch process at operation 230 is a dry etch process. An example of a dry etch process includes a plasma-based dry etch process.

Figure 4E:
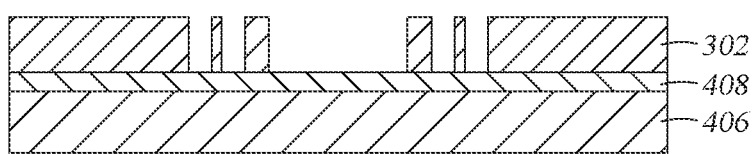
Figure 5E:
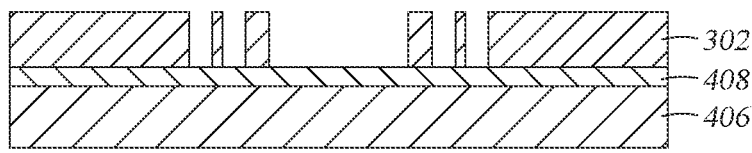

After debris has been removed and the substrate surfaces have been smoothed, the substrate 302 is exposed to a resist stripping process. The stripping process is utilized to de-bond the resist layer 404 from the substrate 302, as depicted in FIGS. 4E and 5E. In one embodiment, a wet process is used to de-bond the resist layer 404 from the substrate 302 by dissolving/solubilizing the resist adhesive layer 409. Other types of etch process are also contemplated for releasing the resist adhesive layer 409. In one embodiment, a mechanical rolling process is used to physically peel off the resist layer 404 or the resist adhesive layer 409 from the substrate 302. In one embodiment, an ashing process is used to remove the resist layer 404 from the substrate 302 by use of, for example, an oxygen plasma assisted process.

Figure 4F:
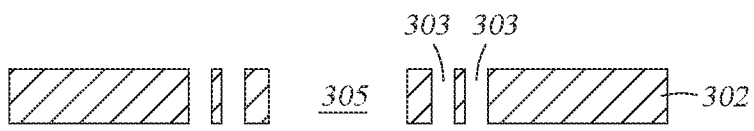
Figure 5F:
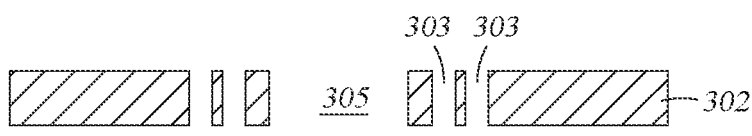

After the resist stripping process, the substrate 302 is exposed to an optional carrier de-bonding process as depicted in FIGS. 4F and 5F. The utilization of the carrier de-bonding process is dependent on whether the substrate 302 is coupled to the carrier plate 406 and the type of bonding material utilized to couple the substrate 302 and the carrier plate 406. As described above and depicted in FIGS. 4A-4F and 5A-5F, in embodiments where the substrate 302 has a thickness of less than about 200 μm, the substrate 302 is coupled to the carrier plate 406 for mechanical support during the formation of features at operation 220. The substrate 302 is coupled to the carrier plate 406 via the adhesive layer 408. Thus, after micro-blasting and subsequent substrate etch and resist stripping, the substrate 302 coupled to the carrier plate 406 is exposed to the carrier de-bonding process to de-bond the substrate 302 from the carrier plate 406 by releasing the adhesive layer 408.

In one embodiment, the adhesive layer 408 is released by exposing the substrate 302 to a bake process. The substrate 302 is exposed to temperatures of between about 50° C. and about 300° C., such as temperatures between about 100° C. and about 250° C. For example, the substrate 302 is exposed to a temperature of between about 150° C. and about 200° C., such as about 160° C. for a desired period of time in order to release the adhesive layer 408. In other embodiments, the adhesive layer 408 is released by exposing the substrate 302 to UV radiation.

Figure 8:
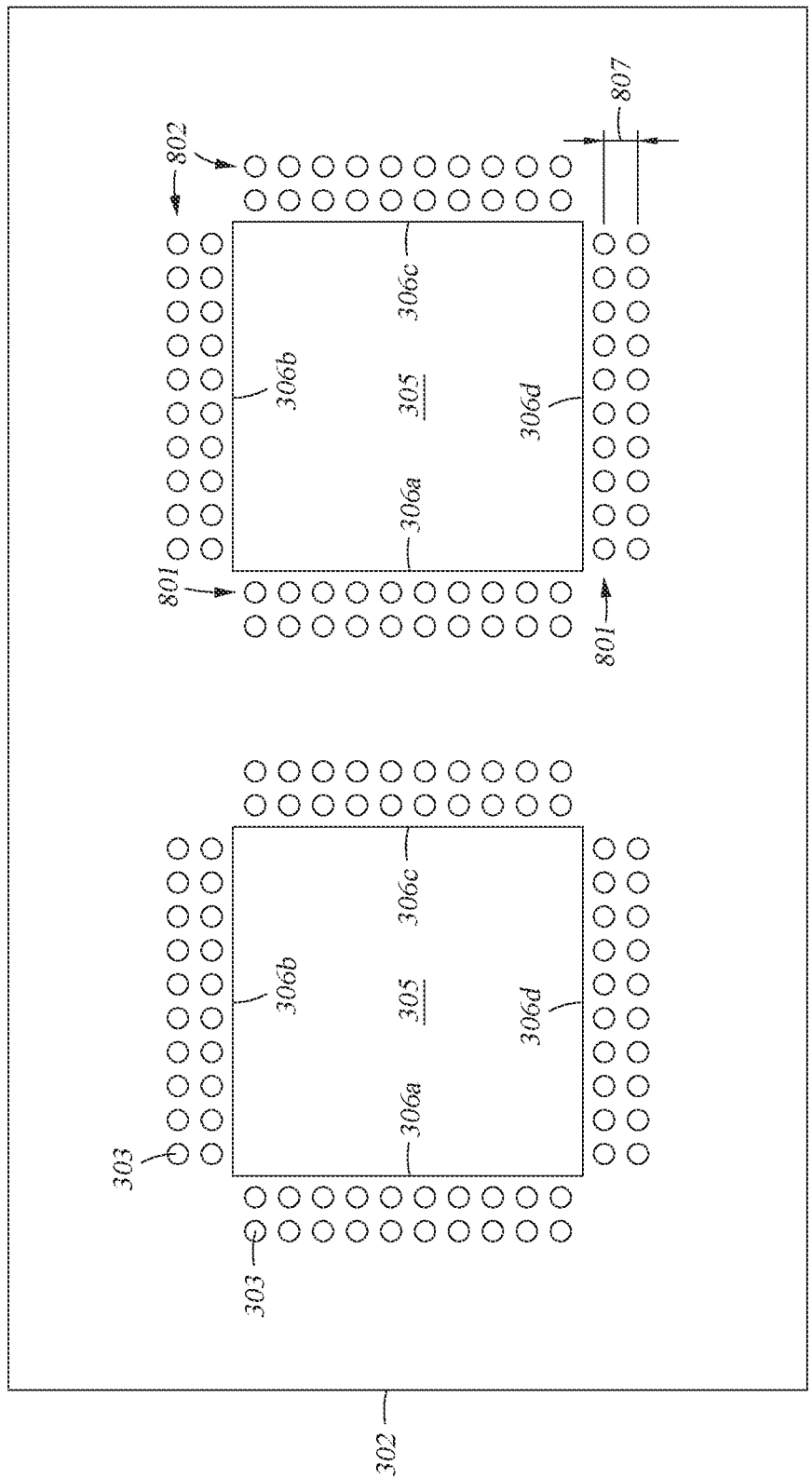
FIG. 8 illustrates a schematic top view of a substrate structured with the processes depicted in FIGS. 2, 3A-3D, 4A-4F, 5A-5F, 6A-6E, and 7A-7D according to an embodiment described herein.

FIGS. 4F and 5F illustrate the substrate 302 after completion of operations 210-230. The cross-sections of the substrate 302 in FIGS. 4F and 5F depict a single cavity 305 formed therethrough and surrounded on either lateral side by two vias 303. A schematic top view of the substrate 302 upon completion of the operations described with reference to FIGS. 4A-4F and 5A-5F is depicted in FIG. 8, described in further detail below.

FIGS. 6A-6E illustrate schematic, cross-sectional views of a substrate 302 during an alternative sequence for operations 220 and 230 similar to those described above. The alternative sequence depicted for operations 220 and 230 involves patterning the substrate 302 on two major opposing surfaces as compared to only one surface, thus enabling increased efficiency during structuring of the substrate 302. The embodiment depicted in FIGS. 6A-6E includes substantially all of the processes as described with reference to FIGS. 4A-4F and 5A-5F. For example, FIG. 6A corresponds with FIGS. 4A and 5A, FIG. 6B corresponds with FIGS. 4B and 5B, FIG. 6C corresponds with FIGS. 4C and 5C, FIG. 6D corresponds with FIGS. 4D and 5D, and FIG. 6E corresponds with FIGS. 4F and 5F. However, unlike the previous embodiments, the embodiment of operation 220 depicted in FIGS. 6A-6E includes a substrate 302 having two resist layers 404 formed on major opposing surfaces 606, 608 thereof, as opposed to one resist layer 404 formed on a single surface. Therefore, the processes performed during operations 210-230 will need to be performed at the same time (i.e., simultaneously) or one after the other (i.e., sequentially) on both sides of the substrate during each operation. While FIGS. 6A-6E only illustrate the formation of vias 303, the processes described herein can also be used to form cavities 305, or cavities 305 and vias 303.

Figure 6A:
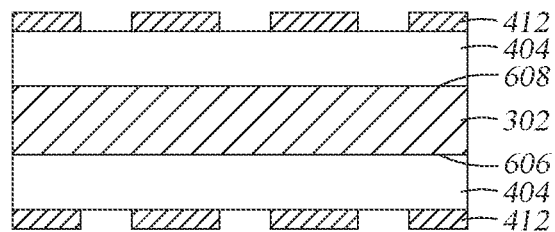
FIGS. 6A-6E schematically illustrate cross-sectional views of a substrate at different stages of feature formation and subsequent damage removal, according to an embodiment described herein.
Figure 6B:
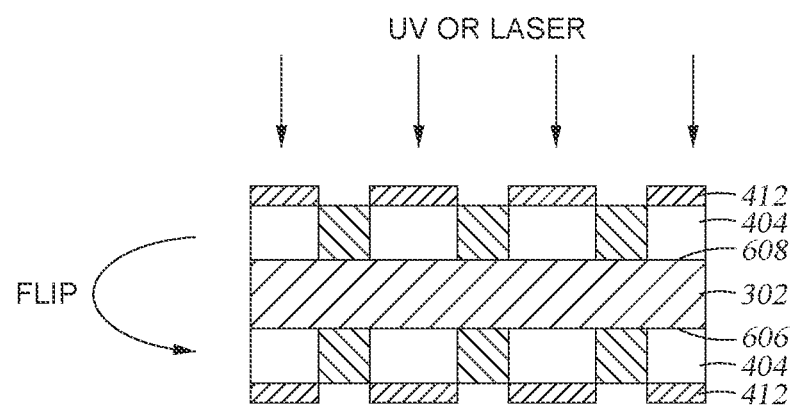
Figure 6C:
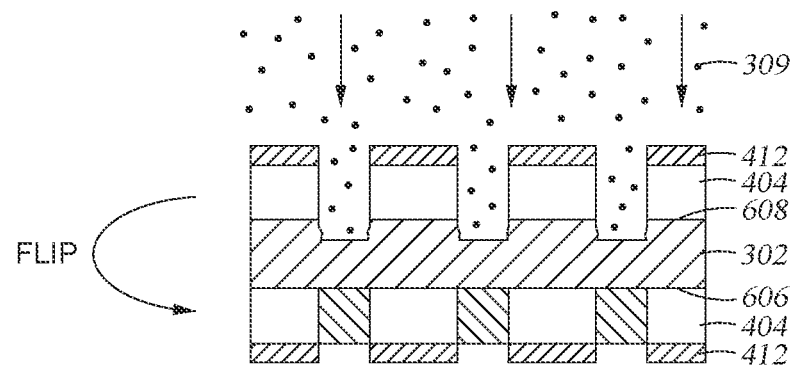
Figure 6D:
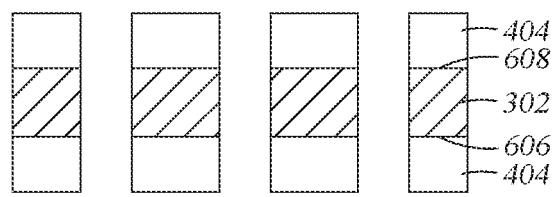
Figure 6E:
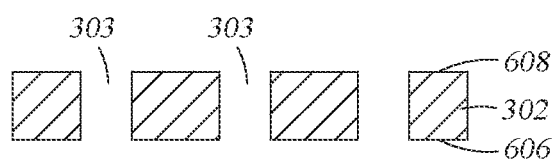

Accordingly, after exposing the resist layer 404 on one side of the substrate 302 to electromagnetic radiation for patterning, such as the side including the surface 608, the substrate 302 may be optionally flipped so that the resist layer 404 on the opposing surface 606 is also exposed to the electromagnetic radiation for patterning, as depicted in FIG. 6B. Similarly, after performing the micro-blasting process on the surface 608 of the substrate 302, the substrate 302 may be optionally flipped so that micro-blasting may be performed against the opposing surface 606 as depicted in FIG. 6C. Thereafter, the substrate 302 is exposed to a second damage removal and cleaning process and a resist stripping process, depicted in FIGS. 6D-6E. By utilizing two resist layers 404 on major opposing surfaces 606, 608 of the substrate 302 and performing the micro-blasting process against both surfaces 606 and 608, potential tapering of the features formed therein by the micro-blasting process may be reduced or eliminated and efficiency of the process used to structure the substrate 302 can be increased.

Figure 7A:
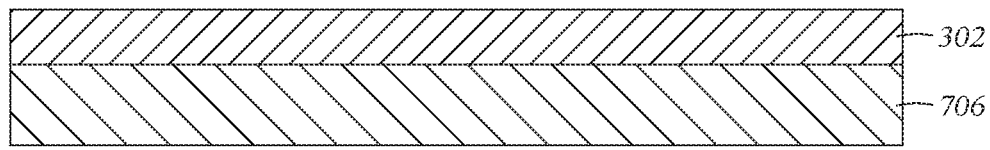
FIGS. 7A-7D schematically illustrate cross-sectional views of a substrate at different stages of feature formation and subsequent damage removal, according to an embodiment described herein.
Figure 7B:
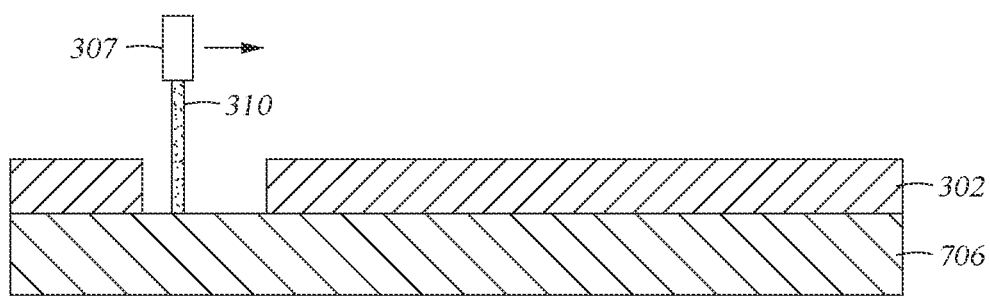

FIGS. 7A-7D illustrate schematic, cross-sectional views of a substrate 302 during another alternative sequence for operations 220 and 230, wherein a desired pattern is formed in the substrate 302 by direct laser ablation. As depicted in FIG. 7A, the substrate 302, such as a solar substrate or even a semiconductor wafer, is placed on a stand 706 of a laser ablation system (not shown). The stand 706 may be any suitable rigid and planar or textured (e.g., structured) surface for providing mechanical support for the substrate 302 during laser ablation. In some embodiments, the stand 706 includes an electrostatic chuck for electrostatic chucking of the substrate 302 to the stand 706. In some embodiments, the stand 706 includes a vacuum chuck for vacuum chucking of the substrate 302 to the stand 706. After placing the substrate 302 on the stand 706, a desired pattern is formed in the substrate 302 by laser ablation, depicted in FIG. 7B.

The laser ablation system may include any suitable type of laser source 307 for patterning the substrate 302. In some examples, the laser source 307 is an infrared (IR) laser. In some examples the laser source 307 is a picosecond UV laser. In other examples, the laser source 307 is a femtosecond UV laser. In yet other examples, the laser source 307 is a femtosecond green laser. The laser source 307 generates a continuous or pulsed laser beam 310 for patterning of the substrate 302. For example, the laser source 307 may generate a pulsed laser beam 310 having a frequency between 5 kHz and 500 kHz, such as between 10 kHz and about 200 kHz. In one example, the laser source 307 is configured to deliver a pulsed laser beam at a wavelength of between about 200 nm and about 1200 nm and at a pulse duration between about 10 ns and about 5000 ns with an output power of between about 10 Watts and about 100 Watts. The laser source 307 is configured to form any desired pattern and features in the substrate 302, including the cavities 305 and the vias 303.

Figure 7C:
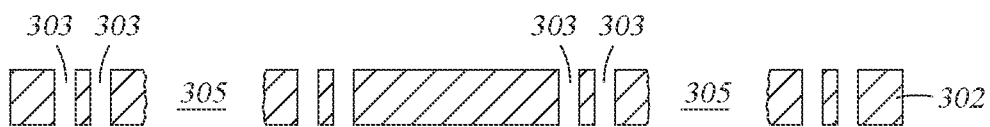
Figure 7D:
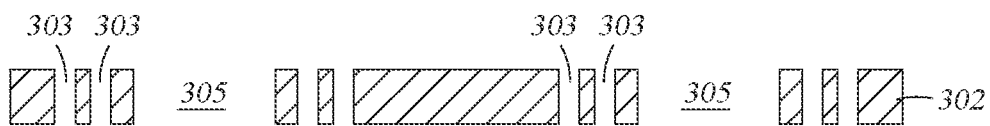

Similar to micro-blasting, the process of direct laser patterning of the substrate 302 may cause unwanted mechanical defects on the surfaces of the substrate 302, including chipping and cracking. Thus, after forming desired features in the substrate 302 by direct laser patterning, the substrate 302 is exposed to a second damage removal and cleaning process substantially similar to embodiments described above. FIGS. 7C-7D illustrate the structured substrate 302 before and after performing the second damage removal and cleaning process, resulting in a smoothened substrate 302 having a cavity 305 and four vias 303 formed therein.

Referring back now to FIG. 2 and FIG. 3D, after removal of mechanical defects in the substrate 302 at operation 230, the substrate 302 is exposed to an oxidation process at operation 240 to grow or deposit an insulating oxide film (i.e. layer) 314 on desired surfaces thereof. For example, the oxide film 314 may be formed on all surfaces of the substrate 302 such that it surrounds the substrate 302. The insulating oxide film 314 acts as a passivating layer on the substrate 302 and provides a protective outer barrier against corrosion and other forms of damage. In one embodiment, the oxidation process is a thermal oxidation process. The thermal oxidation process is performed at a temperature of between about 800° C. and about 1200° C., such as between about 850° C. and about 1150° C. For example, the thermal oxidation process is performed at a temperature of between about 900° C. and about 1100° C., such as a temperature of between about 950° C. and about 1050° C. In one embodiment, the thermal oxidation process is a wet oxidation process utilizing water vapor as an oxidant. In one embodiment, the thermal oxidation process is a dry process utilizing molecular oxygen as the oxidant. It is contemplated that the substrate 302 may be exposed to any suitable oxidation process at operation 240 to form the oxide film 314 thereon. The oxide film 314 generally has a thickness between about 100 nm and about 3 µm, such as between about 200 nm and about 2.5 µm. For example, the oxide film 314 has a thickness between about 300 nm and about 2 µm, such as about 1.5 µm.

FIG. 8 illustrates a schematic top view of an exemplary structured substrate 302 according to one embodiment. The substrate 302 may be structured during operations 210-240 as described above with reference to FIGS. 2, 3A-3D, 4A-4F, 5A-5F, 6A-6E, and 7A-7D. The substrate 302 is illustrated as having two quadrilateral cavities 305, and each cavity 305 is surrounded by a plurality of vias 303. In one embodiment, each cavity 305 is surrounded by two rows 801, 802 of vias 303 arranged along each edge 306a-d of the quadrilateral cavity 305. Although ten vias 303 are depicted in each row 801, 802, it is contemplated that any desired number of vias 303 may be formed in a row. Further, any desired number and arrangement of cavities 305 and vias 303 may be formed in the substrate 302 during operation 220. For example, the substrate 302 may have more or less than two cavities 305 formed therein. In another example, the substrate 302 may have more or less than two rows of vias 303 formed along each edge 306a-d of the cavities 305. In another example, the substrate 302 may have two or more rows of vias 303 wherein the vias 303 in each row are staggered and unaligned with vias 303 of another row.

In one embodiment, the cavities 305 and vias 303 have a depth equal to the thickness of the substrate 302, thus forming holes on opposing surfaces of the substrate 302 (e.g., through the thickness of the substrate 302). For example, the cavities 305 and the vias 303 formed in the substrate 302 may have a depth of between about 50 µm and about 1 mm, such as between about 100 µm and about 200 µm, such as between about 110 µm and about 190 µm, depending on the thickness of the substrate 302. In other embodiments, the cavities 305 and/or the vias 303 may have a depth equal to or less than the thickness of the substrate 302, thus forming a hole in only one surface (e.g., side) of the substrate 302.

In one embodiment, each cavity 305 has lateral dimensions ranging between about 3 mm and about 50 mm, such as between about 8 mm and about 12 mm, such as between about 9 mm and about 11 mm, depending on the size of one or more semiconductor dies 1026 (shown in FIG. 10B) to be embedded therein during package fabrication (described in greater detail below). Semiconductor dies generally include a plurality of integrated electronic circuits that are formed on and/or within a substrate material, such as a piece of semiconductor material. In one embodiment, the cavities 305 are sized to have lateral dimensions substantially similar to that of the dies 1026 to be embedded therein. For example, each cavity 305 is formed having lateral dimensions exceeding those of the dies 1026 by less than about 150 µm, such as less than about 120 µm, such as less than 100 µm. Having a reduced variance in the size of the cavities 305 and the dies 1026 to be embedded therein reduces the amount of gap-fill material utilized thereafter.

In one embodiment, each via 303 has a diameter ranging between about 50 µm and about 200 µm, such as between about 60 µm and about 130 µm, such as between about 80 µm and 110 µm. A minimum pitch 807 between the center of a via 303 in row 801 and a center of an adjacent via 303 in row 802 is between about 70 µm and about 200 µm, such as between about 85 µm and about 160 µm, such as between about 100 µm and 140 µm. Although embodiments are described with reference to FIG. 8, the substrate structuring processes described above with reference to operations 210-240 and FIGS. 2, 3A-3B, 4A-4C, 5A-5C, 6A-6C, and 7A-7B may be utilized to form patterned features in the substrate 302 having any desired depth, lateral dimensions, and morphologies.

Figure 9:
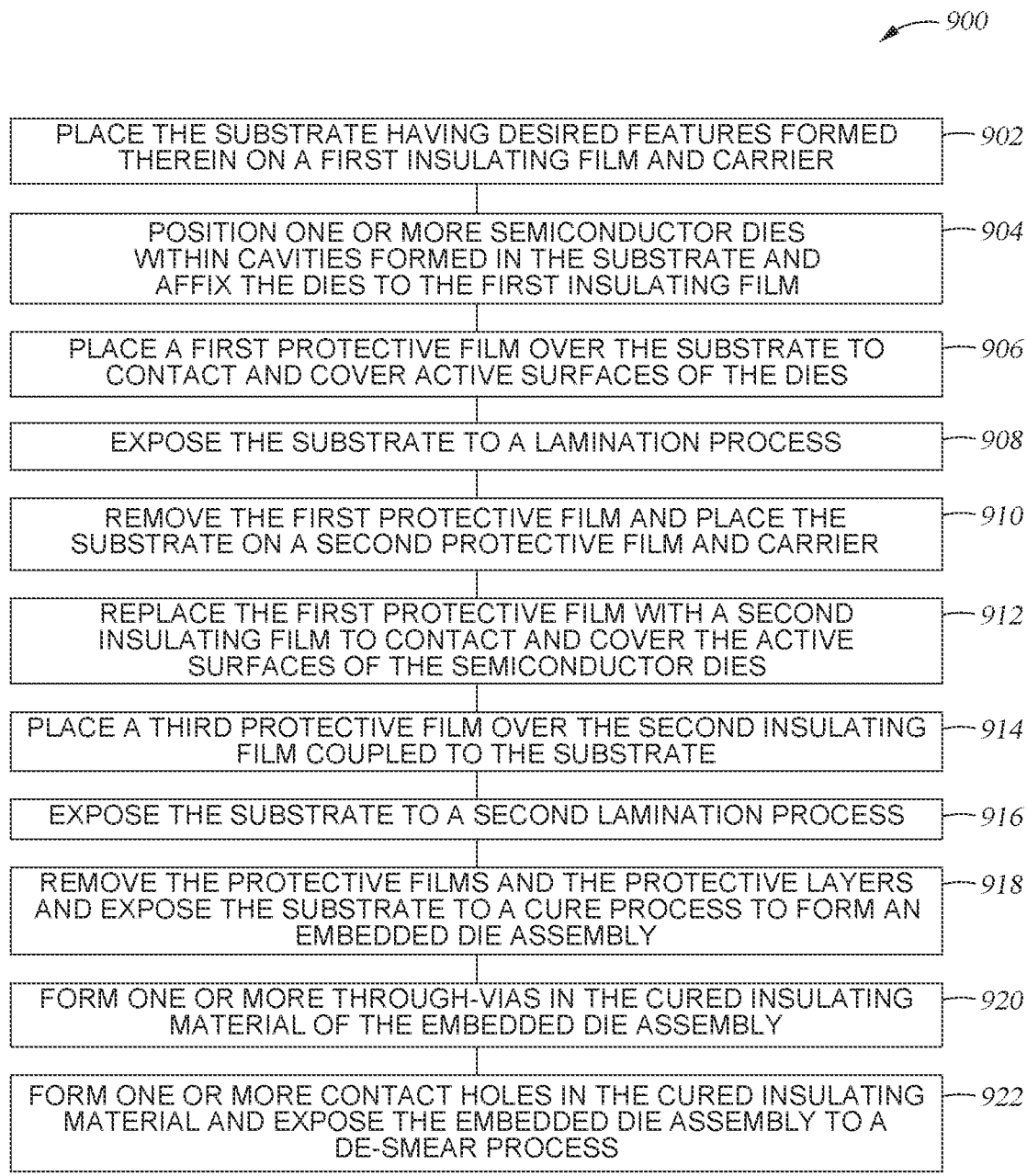
FIG. 9 illustrates a flow diagram of a process for forming an embedded die assembly having through-assembly vias and contact holes, according to an embodiment described herein.

After structuring of the substrate 302, one or more packages are formed around the substrate 302 by utilizing the substrate 302 as a frame. FIGS. 9 and 11 illustrate flow diagrams of representative methods 900 and 1100, respectively, for fabricating an intermediary embedded die assembly 1002 around the substrate 302 prior to final package formation. FIGS. 10A-10K schematically illustrate cross-sectional views of the substrate 302 at different stages of the method 900 depicted in FIG. 9, and FIGS. 12A-12G schematically illustrate cross-sectional views of the substrate 302 at different stages of the method 1100 depicted in FIG. 11. For clarity, FIG. 9 and FIGS. 10A-10K are herein described together and FIG. 11 and FIGS. 12A-12G are herein described together.

Figure 10A:
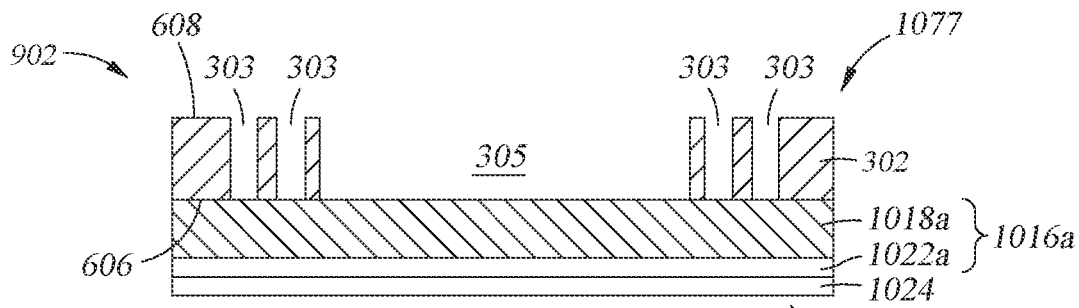
FIGS. 10A-10K schematically illustrate cross-sectional views of the embedded die assembly at different stages of the process depicted in FIG. 9.
Figure 11:
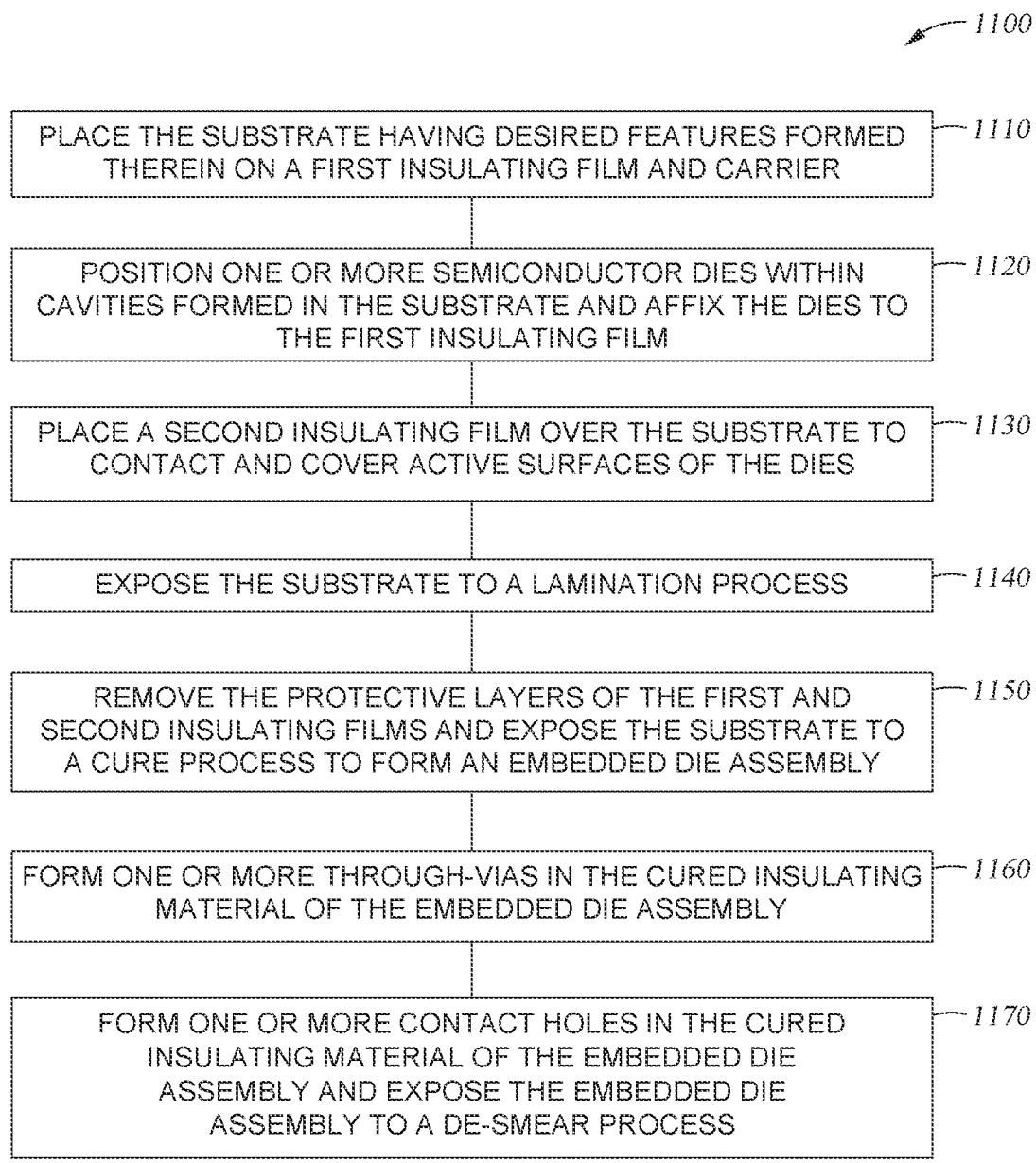
FIG. 11 illustrates a flow diagram of a process for forming an embedded die assembly having through-assembly vias and contact holes, according to an embodiment described herein.

Generally, the method 900 begins at operation 902 and FIG. 10A wherein a first side 1075 (e.g., surface 606) of the substrate 302, now having desired features formed therein, is placed on a first insulating film 1016a. In one embodiment, the first insulating film 1016a includes one or more layers formed of polymer-based dielectric materials. For example, the first insulating film 1016a includes one or more layers formed of flowable build-up materials. In the embodiment depicted in FIG. 10A, the first insulating film 1016a includes a flowable epoxy resin layer 1018a. The epoxy resin layer 1018a may be formed of a ceramic-filler-containing epoxy resin, such as an epoxy resin filled with (e.g., containing) silica ($SiO_2$) particles. Other examples of ceramic fillers that may be utilized to form the epoxy resin layer 1018a and other layers of the insulating film 1016a include aluminum nitride (AlN), aluminum oxide ($Al_2O_3$), silicon carbide (SiC), silicon nitride ($Si_3N_4$), $Sr_2Ce_2Ti_5O_{16}$, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. In some examples, the ceramic fillers utilized to form the epoxy resin layer 1018a have particles ranging in size between about 40 nm and about 1.5 µm, such as between about 80 nm and about 1 µm. For example, the ceramic fillers utilized to form the epoxy resin layer 1018a have particles ranging in size between about 200 nm and about 800 nm, such as between about 300 nm and about 600 nm. In some embodiments, the ceramic fillers utilized to form the epoxy resin layer 1018a include particles having a size less than about 25% of the desired feature (e.g., via, cavity, or through-assembly via) width or diameter, such as less than about 15% of the desired feature width or diameter.

The epoxy resin layer 1018a typically has a thickness less than about 60 pm, such as between about 5 µm and about 50 µm. For example, the epoxy resin layer 1018a has a thickness between about 10 µm and about 25 µm. In one embodiment, the insulating film 1016a further includes one or more protective layers. For example, the insulating film 1016a includes a polyethylene terephthalate (PET) protective layer 1022a. However, any suitable combination of layers and insulating materials is contemplated for the insulating film 1016a. In some embodiments, the entire insulating film 1016*a* has a thickness less than about 120 µm, such as a thickness less than about 90 µm.

The substrate 302, which is coupled to the insulating film 1016*a* on the first side 1075 thereof, and specifically to the epoxy resin layer 1018*a* of the insulating film 1016*a*, may further be optionally placed on a carrier 1024 for mechanical support during later processing operations. The carrier is formed of any suitable mechanically and thermally stable material. For example, the carrier 1024 is formed of polytetrafluoroethylene (PTFE). In another example, the carrier 1024 is formed of PET.

Figure 10B:
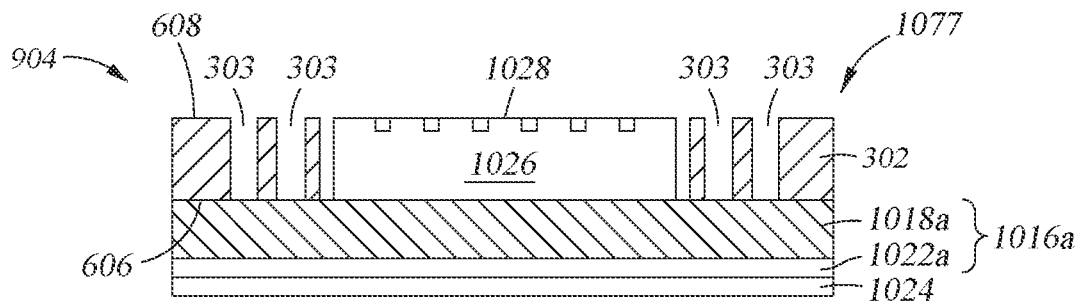

At operation 904 and depicted in FIG. 10B, one or more semiconductor dies 1026 are placed within the cavities 305 formed in the substrate 302, so that the semiconductor dies 1026 are now bound by the insulating film 1016*a* on one side (a single semiconductor die 1026 is depicted in FIG. 10B). In one embodiment, the dies 1026 are multipurpose dies having integrated circuits formed on an active surface 1028 thereof. The dies 1026 are placed within the cavities 305 and positioned onto a surface of the insulating film 1016*a* exposed through the cavities 305. In one embodiment, the dies 1026 are placed on an adhesive layer (not shown) disposed or formed on the insulating film 1016*a*.

Figure 10C:
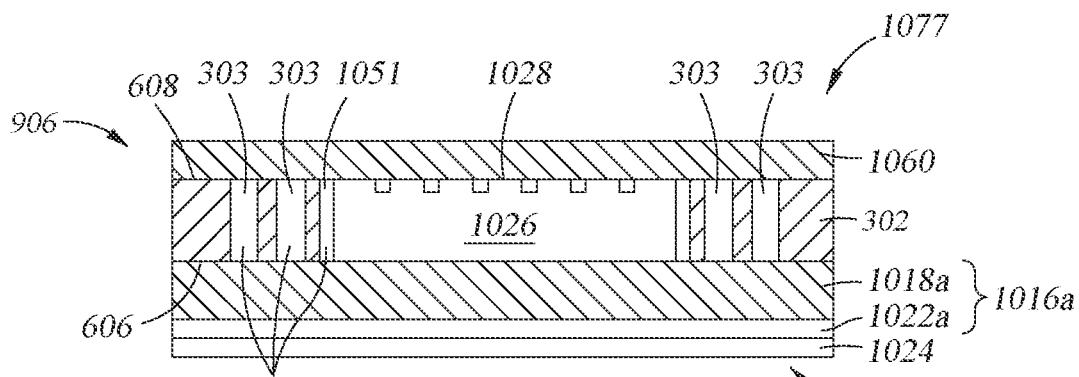

After placement of the dies 1026 within the cavities 305, a first protective film 1060 is placed over a second side 1077 (e.g., surface 608) of the substrate 302 at operation 906 and FIG. 10C. The protective film 1060 is coupled to the second side 1077 of the substrate 302 and opposite of the first insulating film 1016*a* such that it contacts and covers the active surfaces 1028 of the dies 1026 disposed within the cavities 305. In one embodiment, the protective film 1060 is formed of a similar material to that of the protective layer 1022*a*. For example, the protective film 1060 is formed of PET, such as biaxial PET. However, the protective film 1060 may be formed of any suitable protective materials. In some embodiments, the protective film 1060 has a thickness between about 50 µm and about 150 µm.

Figure 10D:
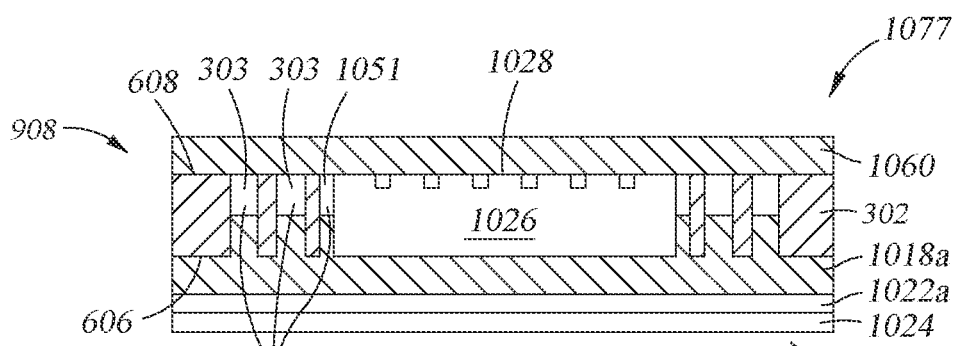

The substrate 302, now affixed to the insulating film 1016*a* on the first side 1075 and the protective film 1060 on the second side 1077 and further having dies 1026 disposed therein, is exposed to a lamination process at operation 908. During the lamination process, the substrate 302 is exposed to elevated temperatures, causing the epoxy resin layer 1018*a* of the insulating film 1016*a* to soften and flow into the open voids or volumes between the insulating film 1016*a* and the protective film 1060, such as into the vias 303 and gaps 1051 between the interior walls of the cavities 305 and the dies 1026. Accordingly, the semiconductor dies 1026 become at least partially embedded within the material of the insulating film 1016*a* and the substrate 302, as depicted in FIG. 10D.

In one embodiment, the lamination process is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 5 seconds and about 1.5 minutes, such as between about 30 seconds and about 1 minute. In some embodiments, the lamination process includes the application of a pressure of between about 1 psig and about 50 psig while a temperature of between about 80° C. and about 140° C. is applied to substrate 302 and insulating film 1016*a* for a period between about 5 seconds and about 1.5 minutes. For example, the lamination process is performed at a pressure of between about 5 psig and about 40 psig, a temperature of between about 100° C. and about 120° C. for a period between about 10 seconds and about 1 minute. For example, the lamination process is performed at a temperature of about 110° C. for a period of about 20 seconds.

Figure 10E:
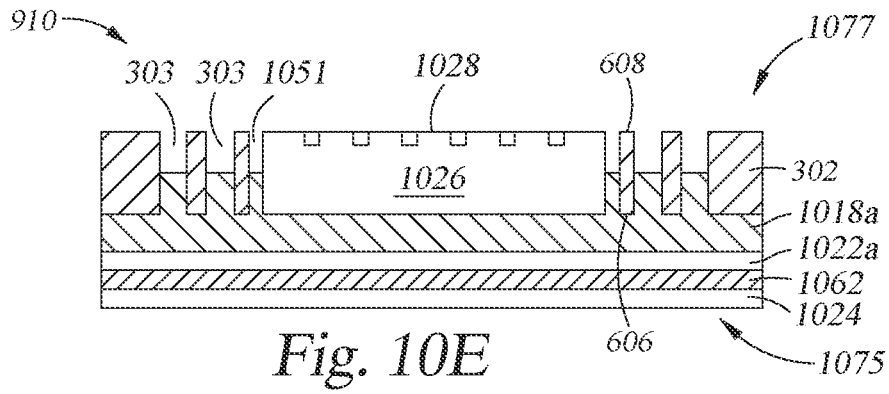

At operation 910, the protective film 1060 is removed and the substrate 302, now having the laminated insulating material of the epoxy resin layer 1018*a* at least partially surrounding the substrate 302 and the one or more dies 1026, is placed on a second protective film 1062. As depicted in FIG. 10E, the second protective film 1062 is coupled to the first side 1075 of the substrate 302 such that the second protective film 1062 is disposed against (e.g., adjacent) the protective layer 1022*a* of the insulating film 1016*a*. In some embodiments, the substrate 302, now coupled to the protective film 1062, may be optionally placed on the carrier 1024 for additional mechanical support on the first side 1075. In some embodiments, the protective film 1062 is placed on the carrier 1024 prior to coupling the protective film 1062 with the substrate 302, now laminated with the insulating film 1016*a*.

Generally, the protective film 1062 is substantially similar in composition to the protective film 1060. For example, the protective film 1062 may be formed of PET, such as biaxial PET. However, the protective film 1062 may be formed of any suitable protective materials. In some embodiments, the protective film 1062 has a thickness between about 50 µm and about 150 µm.

Figure 10F:
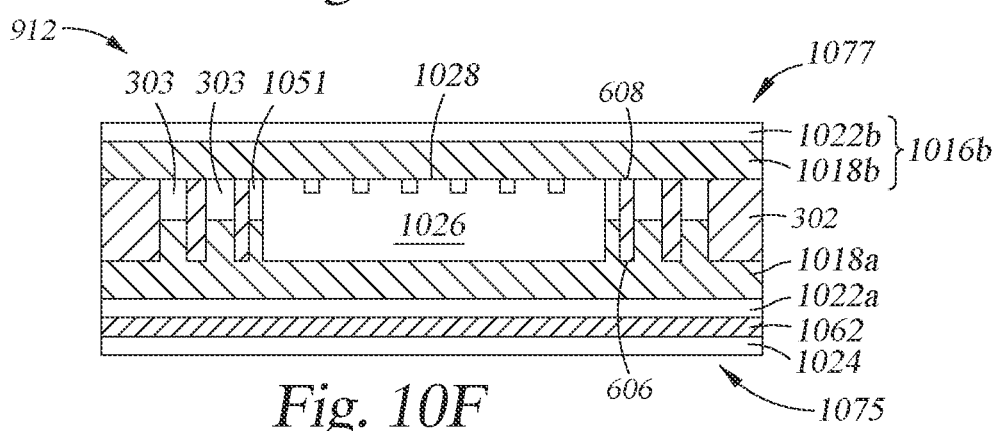

Upon coupling the substrate 302 to the second protective film 1062, a second insulating film 1016*b* substantially similar to the first insulating film 1016*a* is placed on the second side 1077 of the substrate 302 at operation 912 and FIG. 10F, thus replacing the protective film 1060. In one embodiment, the second insulating film 1016*b* is positioned on the second side 1077 of the substrate 302 such that an epoxy resin layer 1018*b* of the second insulating film 1016*b* contacts and covers the active surface 1028 of the dies 1026 within the cavities 305. In one embodiment, the placement of the second insulating film 1016*b* on the substrate 302 may form one or more voids between the insulating film 1016*b* and the already-laminated insulating material of the epoxy resin layer 1018*a* partially surrounding the one or more dies 1026. The second insulating film 1016*b* may include one or more layers formed of polymer-based dielectric materials. As depicted in FIG. 10F, the second insulating film 1016*b* includes an epoxy resin layer 1018*b* which is similar to the epoxy resin layer 1018*a* described above. The second insulating film 1016*b* may further include a protective layer 1022*b* formed of similar materials to the protective layer 1022*a*, such as PET.

Figure 10G:
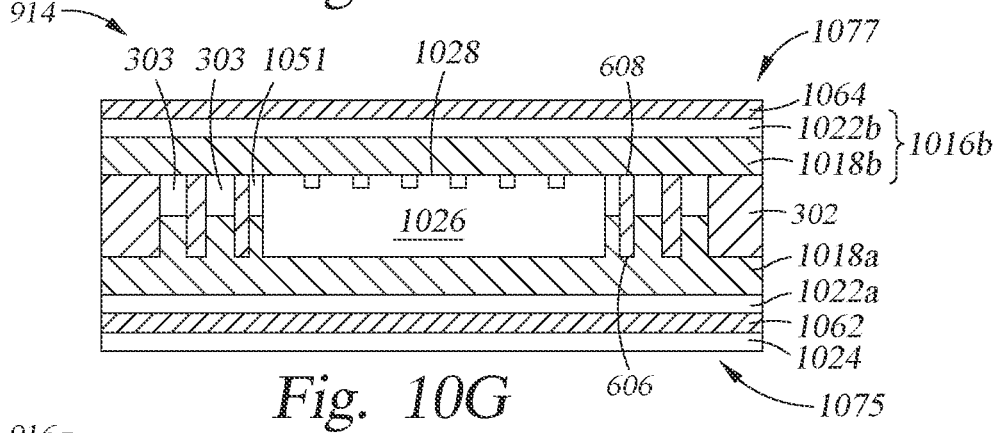

At operation 914, a third protective film 1064 is placed over the second insulating film 1016*b*, as depicted in FIG. 10G. Generally, the protective film 1064 is substantially similar in composition to the protective films 1060, 1062. For example, the protective film 1064 is formed of PET, such as biaxial PET. However, the protective film 1064 may be formed of any suitable protective materials. In some embodiments, the protective film 1064 has a thickness between about 50 µm and about 150 µm.

Figure 10H:
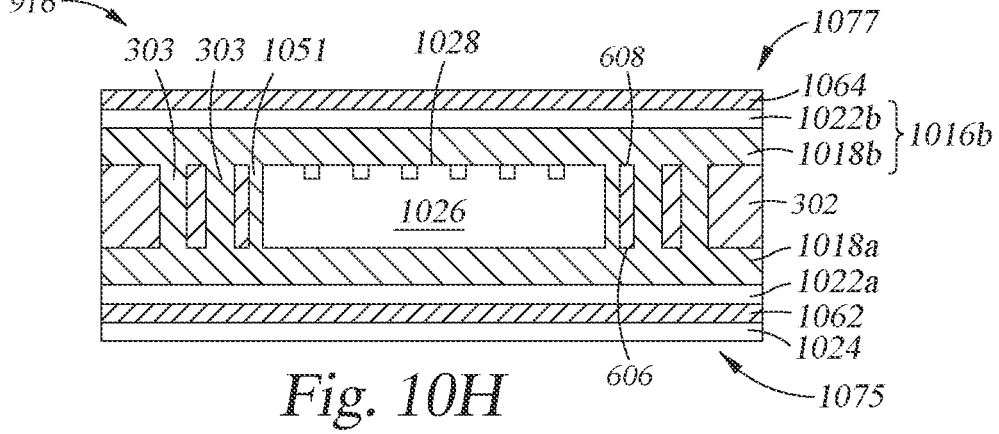

The substrate 302, now affixed to the insulating film 1016*b* and protective layer 1064 on the second side 1077 and the protective film 1062 and optional carrier 1024 on the first side 1075, is exposed to a second lamination process at operation 916 and FIG. 10H. Similar to the lamination process at operation 908, the substrate 302 is exposed to elevated temperatures, causing the epoxy resin layer 1018*b* of the insulating film 1016*b* to soften and flow into any open voids or volumes between the insulating film 1016*b* and the already-laminated insulating material of the epoxy resin layer 1018a, thus integrating itself with the insulating material of the epoxy resin layer 1018a. Accordingly, the cavities 305 and the vias 303 become filled (e.g. packed, sealed) with insulating material, and the semiconductor dies 1026 previously placed within the cavities 305 become entirely embedded within the insulating material of the epoxy resin layers 1018a, 1018b.

In one embodiment, the lamination process is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between about 10 psig and about 150 psig while a temperature of between about 80° C. and about 140° C. is applied to substrate 302 and insulting film 1016b for a period between about 1 minute and about 30 minutes. For example, the lamination process is performed at a pressure of between about 20 psig and about 100 psig, a temperature of between about 100° C. and about 120° C. for a period between about 2 minutes and 10 minutes. For example, the lamination process is performed at a temperature of about 110° C. for a period of about 5 minutes.

Figure 10I:
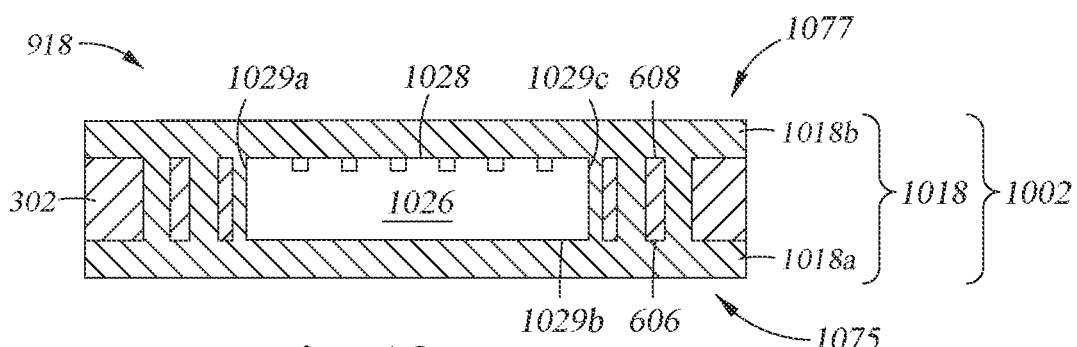
Figure 10J:
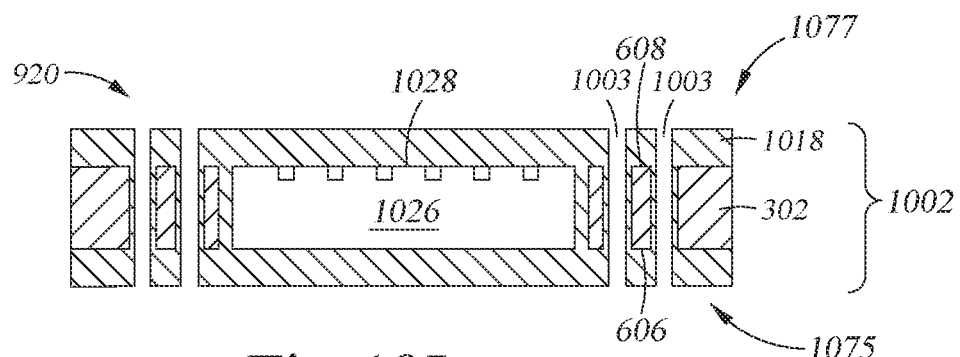

After lamination, the substrate 302 is disengaged from the carrier 1024 and the protective films 1062, 1064 are removed at operation 918, resulting in a laminated embedded die assembly 1002. As depicted in FIG. 10I, the embedded die assembly 1002 includes the substrate 302 having one or more cavities 305 and/or vias 303 formed therein and filled with the insulating dielectric material of the epoxy resin layers 1018a, 1018b, as well as the embedded dies 1026 within the cavities 305. The insulating dielectric material of the epoxy resin layers 1018a, 1018b encases the substrate 302 such that the insulating material covers at least two surfaces or sides of the substrate 302, such as the two major surfaces 606, 608, and covers all sides of the embedded semiconductor dies 1026. In some examples, the protective layers 1022a, 1022b are also removed from the embedded die assembly 1002 at operation 918. Generally, the protective layers 1022a and 1022b, the carrier 1024, and the protective films 1062 and 1064 are removed from the embedded die assembly 1002 by any suitable mechanical processes, such as peeling therefrom.

Upon removal of the protective layers 1022a, 1022b and the protective films 1062, 1064, the embedded die assembly 1002 is exposed to a cure process to fully cure (i.e. harden through chemical reactions and cross-linking) the insulating dielectric material of the epoxy resin layers 1018a, 1018b, thus forming a cured insulating layer 1018. The insulating layer 1018 substantially surrounds the substrate 302 and the semiconductor dies 1026 embedded therein. For example, the insulating layer 1018 contacts or encapsulates at least the sides 1075, 1077 of the substrate 302 (including surfaces 606, 608) and at least six sides or surfaces of each semiconductor die 1026, which has a rectangular prism shape as illustrated in FIG. 10I (i.e., only four surfaces 1028 and 1029 shown in 2D view).

In one embodiment, the cure process is performed at high temperatures to fully cure the embedded die assembly 1002. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 918 is performed at or near ambient (e.g. atmospheric) pressure conditions.

After curing, one or more through-assembly vias 1003 are drilled through the embedded die assembly 1002 at operation 920, forming channels through the entire thickness of the embedded die assembly 1002 for subsequent interconnection formation. In some embodiments, the embedded die assembly 1002 may be placed on a carrier, such as the carrier 1024, for mechanical support during the formation of the through-assembly vias 1003 and subsequent contact holes 1032. The through-assembly vias 1003 are drilled through the vias 303 that were formed in the substrate 302 and subsequently filled with the insulating layer 1018. Thus, the through-assembly vias 1003 may be circumferentially surrounded by the insulating layer 1018 filled within the vias 303. By having the ceramic-filler-containing epoxy resin material of the insulating layer 1018 line the walls of the vias 303, capacitive coupling between the conductive silicon-based substrate 302 and interconnections 1444 (described with reference to FIG. 13 and FIGS. 14E-14H), and thus capacitive coupling between adjacently positioned vias 303 and/or redistribution connections 1644 (described with reference to FIG. 15 and FIGS. 16H-16L), in the completed package 1602 (described with reference to FIG. 15 and FIGS. 16K and 16L) is significantly reduced as compared to other conventional interconnecting structures that utilize conventional via insulating liners or films. Furthermore, the flowable nature of the epoxy resin material enables more consistent and reliable encapsulation and insulation, thus enhancing electrical performance by minimizing leakage current of the completed package 1602.

In one embodiment, the through-assembly vias 1003 have a diameter less than about 100 μm, such as less than about 75 μm. For example, the through-assembly vias 1003 have a diameter less than about 60 μm, such as less than about 50 μm. In one embodiment, the through-assembly vias 1003 have a diameter of between about 25 μm and about 50 μm, such as a diameter of between about 35 μm and about 40 μm. In one embodiment, the through assembly vias 1003 are formed using any suitable mechanical process. For example, the through-assembly vias 1003 are formed using a mechanical drilling process. In one embodiment, through-assembly vias 1003 are formed through the embedded assembly 1002 by laser ablation. For example, the through-assembly vias 1003 are formed using an ultraviolet laser. In one embodiment, the laser source utilized for laser ablation has a frequency between about 5 kHz and about 500 kHz. In one embodiment, the laser source is configured to deliver a pulsed laser beam at a pulse duration between about 10 ns and about 100 ns with a pulse energy of between about 50 microjoules (μJ) and about 500 μJ. Utilizing an epoxy resin material having small ceramic filler particles further promotes more precise and accurate laser patterning of small-diameter vias, such as the vias 1003, as the small ceramic filler particles therein exhibit reduced laser light reflection, scattering, diffraction and transmission of the laser light away from the area in which the via is to be formed during the laser ablation process.

Figure 10K:
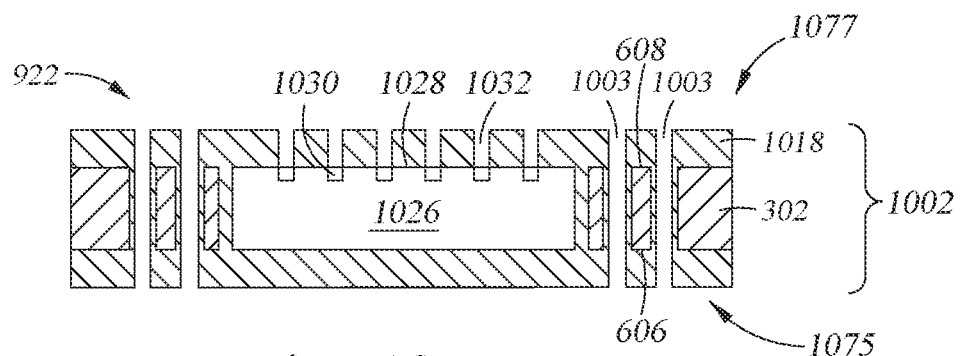

At operation 922 and FIG. 10K, one or more contact holes 1032 are drilled through the insulating layer 1018 to expose one or more contacts 1030 formed on the active surface 1028 of each embedded die 1026. The contact holes 1032 are drilled through the insulating layer 1018 by laser ablation, leaving all external surfaces of the semiconductor dies 1026 covered and surrounded by the insulating layer 1018 and the contacts 1030 exposed. Thus, the contacts 1030 are exposed by the formation of the contact holes 1032. In one embodiment, the laser source may generate a pulsed laser beam having a frequency between about 100 kHz and about 1000 kHz. In one embodiment, the laser source is configured to deliver a pulsed laser beam at a wavelength of between about 100 nm and about 2000 nm, at a pulse duration between about 10E-4 ns and about 10E-2 ns, and with a pulse energy of between about 10 µJ and about 300 µJ. In one embodiment, the contact holes 1032 are drilled using a $CO_2$, green, or UV laser. In one embodiment, the contact holes 1032 have a diameter of between about 5 µm and about 60 µm, such as a diameter of between about 20 µm and about 50 µm.

After formation of the contact holes 1032, the embedded die assembly 1002 is exposed to a de-smear process at operation 922 to remove any unwanted residues and/or debris caused by laser ablation during the formation of the through-assembly vias 1003 and the contact holes 1032. The de-smear process thus cleans the through-assembly vias 1003 and contact holes 1032 and fully exposes the contacts 1030 on the active surfaces 1028 of the embedded die 1026 for subsequent metallization. In one embodiment, the de-smear process is a wet de-smear process. Any suitable aqueous etchants, solvents, and/or combinations thereof may be utilized for the wet de-smear process. In one example, potassium permanganate ($KMnO_4$) solution may be utilized as an etchant. Depending on the residue thickness, exposure of the embedded die assembly 1002 to the wet de-smear process at operation 922 may be varied. In another embodiment, the de-smear process is a dry de-smear process. For example, the de-smear process may be a plasma de-smear process with an $O_2$:$CF_4$ mixture gas. The plasma de-smear process may include generating a plasma by applying a power of about 700 W and flowing $O_2$:$CF_4$ at a ratio of about 10:1 (e.g., 100:10 sccm) for a time period between about 60 seconds and about 120 seconds. In further embodiments, the de-smear process is a combination of wet and dry processes.

Following the de-smear process at operation 922, the embedded die assembly 1002 is ready for formation of interconnection paths therein, described below with reference to FIG. 13 and FIGS. 14A-14H.

As discussed above, FIG. 9 and FIGS. 10A-10K illustrate a representative method 900 for forming the intermediary embedded die assembly 1002. FIG. 11 and FIGS. 12A-12G illustrate an alternative method 1100 substantially similar to the method 900 but with fewer operations. The method 1100 generally includes seven operations 1110-1170. However, operations 1110, 1120, 1160, and 1170 of the method 1100 are substantially similar to the operations 902, 904, 920, and 922 of the method 900, respectively. Thus, only operations 1130, 1140, and 1150, depicted in FIGS. 12C, 12D, and 12E, respectively, are herein described for clarity.

Figure 12A:
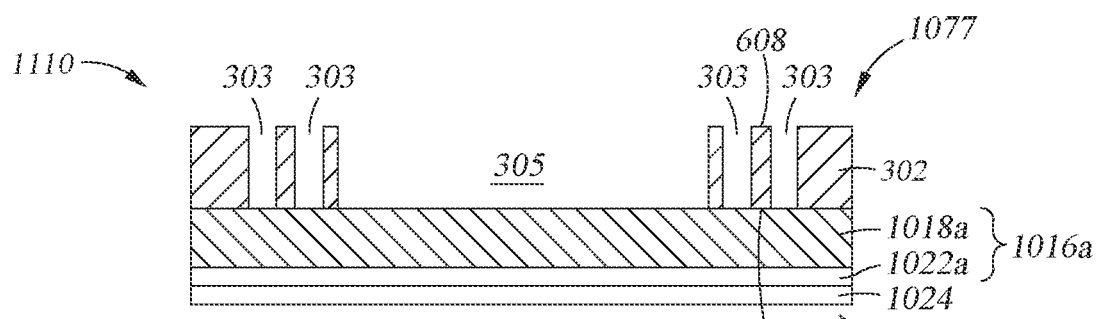
FIGS. 12A-12G schematically illustrate cross-sectional views of the embedded die assembly at different stages of the process depicted in FIG. 11.
Figure 12B:
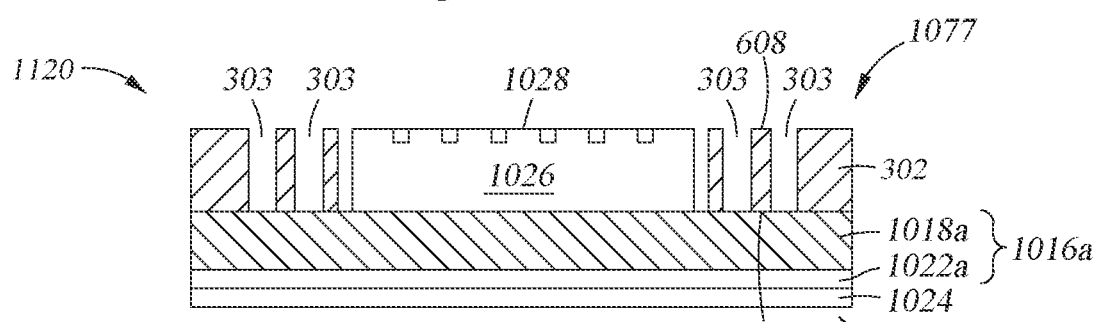
Figure 12C:
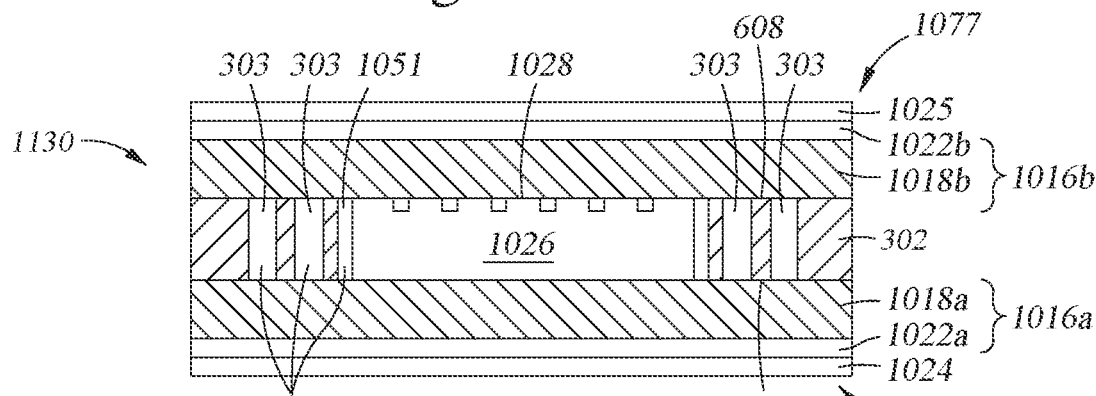

After placement of the one or more semiconductor dies 1026 onto a surface of the insulating film 1016a exposed through the cavities 305, the second insulating film 1016b is positioned over the second side 1077 (e.g., surface 608) of the substrate 302 at operation 1130 and FIG. 12C, prior to lamination. In some embodiments, the second insulating film 1016b is positioned on the second side 1077 of the substrate 302 such that the epoxy resin layer 1018b of the second insulating film 1016b contacts and covers the active surface 1028 of the dies 1026 within the cavities 305. In some embodiments, a second carrier 1025 is affixed to the protective layer 1022b of the second insulating film 1016b for additional mechanical support during later processing operations. As depicted in FIG. 12C, one or more voids 1050 are formed between the insulating films 1016a and 1016b through the vias 303 and gaps 1051 between the semiconductor dies 1026 and interior walls of the cavities 305.

Figure 12D:
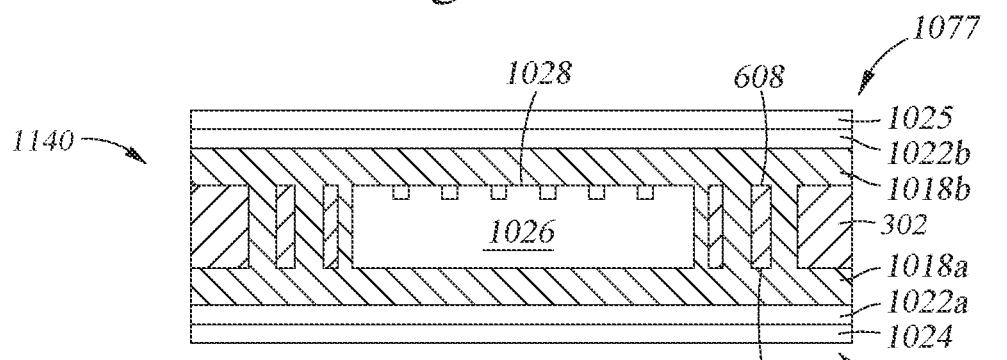

At operation 1140 and FIG. 12D, the substrate 302, now affixed to the insulating films 1016a and 1016b and having dies 1026 disposed therein, is exposed to a single lamination process. During the single lamination process, the substrate 302 is exposed to elevated temperatures, causing the epoxy resin layers 1018a and 1018b of both insulating films 1016a, 1016b to soften and flow into the open voids or volumes between the insulating films 1016a, 1016b, such as into the vias 303 and gaps 1051 between the interior walls of the cavities 305 and the dies 1026. Accordingly, the semiconductor dies 1026 become embedded within the material of the insulating films 1016a, 1016b and the vias 303 filled therewith.

Similar to the lamination processes described with reference to FIG. 9 and FIGS. 10A-10K, the lamination process at operation 1140 may be a vacuum lamination process that may be performed in an autoclave or other suitable device. In another embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between about 1 psig and about 150 psig while a temperature of between about 80° C. and about 140° C. is applied to substrate 302 and insulating film 1016a, 1016b layers for a period between about 1 minute and about 30 minutes. For example, the lamination process is performed at a pressure of between about 10 psig and about 100 psig, a temperature of between about 100° C. and about 120° C. for a period between about 2 minutes and 10 minutes. For example, the lamination process is performed at a temperature of about 110° C. for a period of about 5 minutes.

Figure 12E:
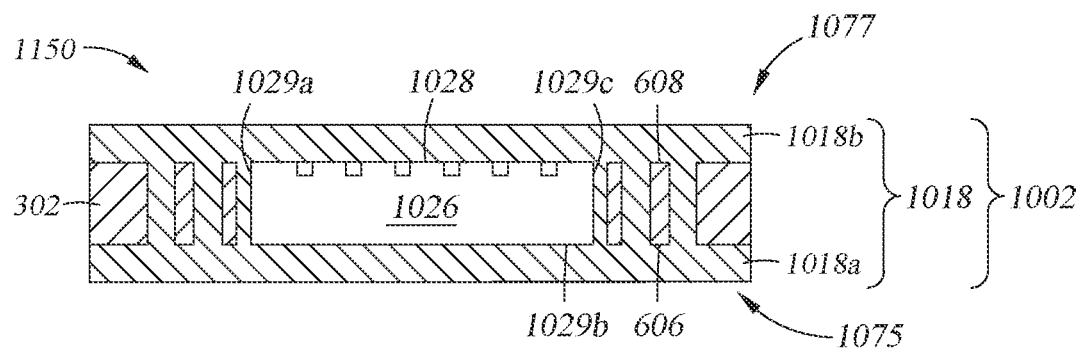
Figure 12F:
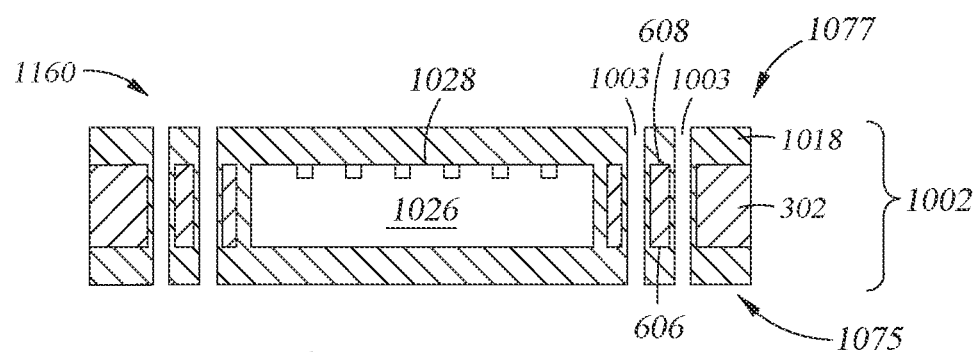
Figure 12G:
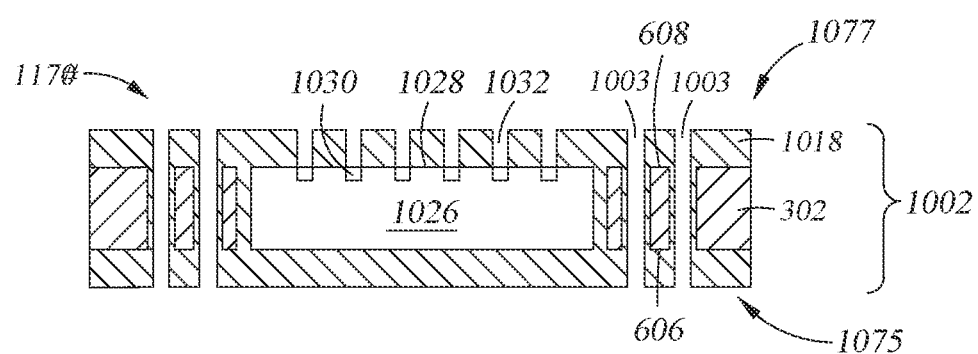

At operation 1150, the one or more protective layers of the insulating films 1016a and 1016b are removed from the substrate 302, resulting in the laminated embedded die assembly 1002. As depicted in FIG. 12E, the embedded die assembly 1002 includes the substrate 302 having one or more cavities 305 and/or vias 303 formed therein and filled with the insulating dielectric material of the epoxy resin layers 1018a, 1018b, as well as the embedded dies 1026 within the cavities 305. The insulating material encases the substrate 302 such that the insulating material covers at least two surfaces or sides of the substrate 302, for example surfaces 606, 608. In one example, the protective layers 1022a, 1022b are removed from the embedded die assembly 1002, and thus the embedded die assembly 1002 is disengaged from the carriers 1024, 1025. Generally, the protective layers 1022a, 1022b and the carriers 1024, 1025 are removed by any suitable mechanical processes, such as peeling therefrom.

Upon removal of the protective layers 1022a, 1022b, the embedded die assembly 1002 is exposed to a cure process to fully cure the insulating dielectric material of the epoxy resin layers 1018a, 1018b. Curing of the insulating material results in the formation of the cured insulating layer 1018. As depicted in FIG. 12E and similar to operation 918 corresponding with FIG. 10l, the insulating layer 1018 substantially surrounds the substrate 302 and the semiconductor dies 1026 embedded therein.

In one embodiment, the cure process is performed at high temperatures to fully cure the embedded die assembly 1002. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 1150 is performed at or near ambient (e.g. atmospheric) pressure conditions.

After curing at operation 1150, the method 1100 is substantially similar to operations 920 and 922 of the method 900. For example, the embedded die assembly 1002 has one or more through-assembly vias 1003 and one or more contact holes 1032 drilled through the insulating layer 1018. Subsequently, the embedded die assembly 1002 is exposed to a de-smear process, after which the embedded die assembly 1002 is ready for formation of interconnection paths therein, as described below.

Figure 13:
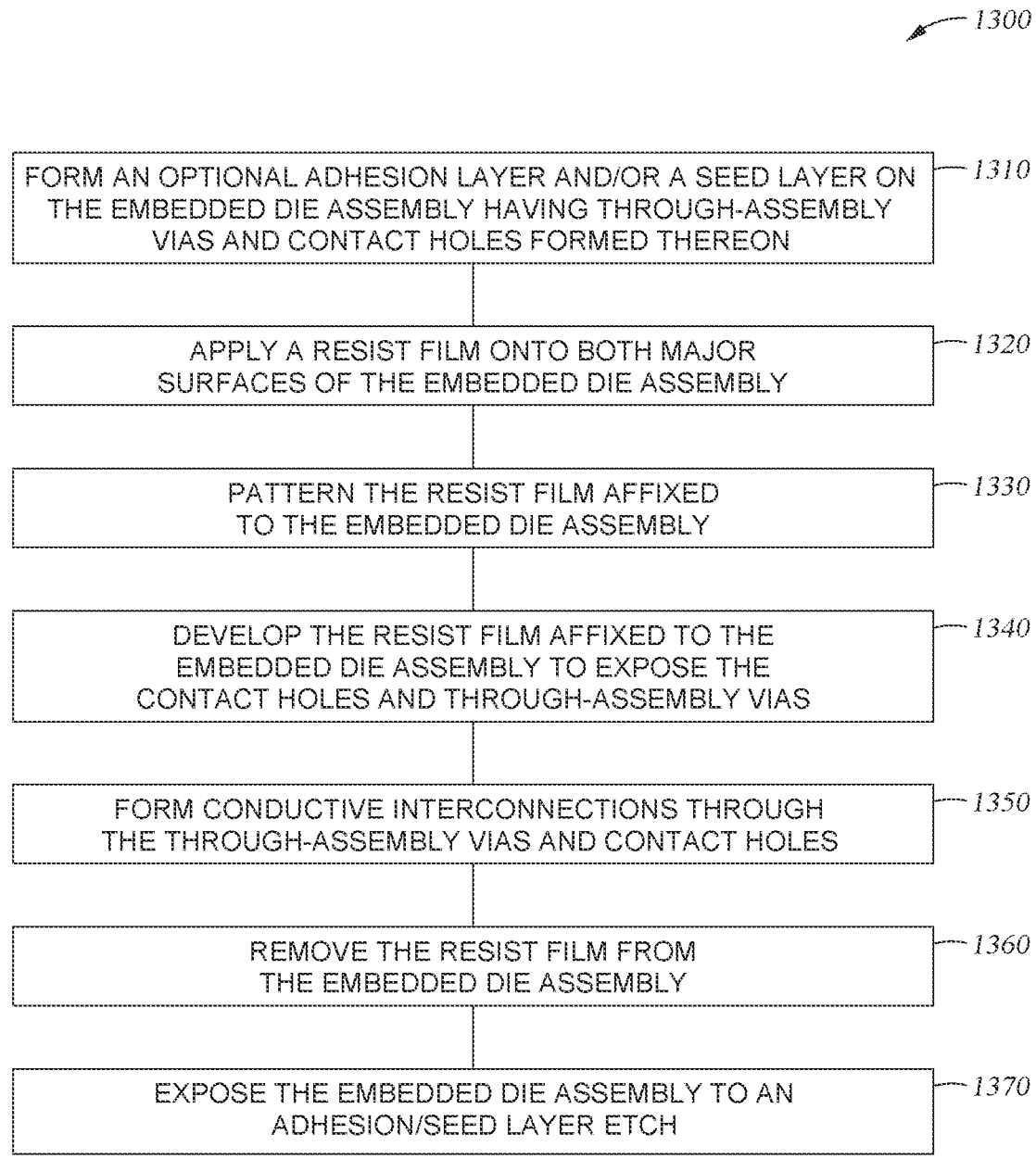
FIG. 13 illustrates a flow diagram of a process for forming interconnections in an embedded die assembly, according to an embodiment described herein.

FIG. 13 illustrates a flow diagram of a representative method 1300 of forming electrical interconnections through the embedded die assembly 1002. FIGS. 14A-14H schematically illustrate cross-sectional views of the embedded die assembly 1002 at different stages of the process of the method 1300 depicted in FIG. 13. Thus, FIG. 13 and FIGS. 14A-14H are herein described together for clarity.

In one embodiment, the electrical interconnections formed through the embedded die assembly 1002 are formed of copper. Thus, the method 1300 may optionally begin at operation 1310 and FIG. 14A wherein the embedded die assembly 1002, having through-assembly vias 1003 and contact holes 1032 formed therein, has an adhesion layer 1440 and/or a seed layer 1442 formed thereon. An enlarged partial view of the adhesion layer 1440 and the seed layer 1442 formed on the embedded die assembly 1002 is depicted in FIG. 14H for reference. The adhesion layer 1440 may be formed on desired surfaces of the insulating layer 1018, such as major surfaces 1005, 1007 of the embedded die assembly 1002, as well as on the active surfaces 1028 of the contact holes 1032 on each die 1026 and interior walls of the through-assembly vias 1003, to assist in promoting adhesion and blocking diffusion of the subsequently formed seed layer 1442 and copper interconnections 1444. Thus, in one embodiment, the adhesion layer 1440 acts as an adhesion layer; in another embodiment, the adhesion layer 1440 acts as a barrier layer. In both embodiments, however, the adhesion layer 1440 will be hereinafter described as an "adhesion layer."

In one embodiment, the optional adhesion layer 1440 is formed of titanium, titanium nitride, tantalum, tantalum nitride, manganese, manganese oxide, molybdenum, cobalt oxide, cobalt nitride, or any other suitable materials or combinations thereof. In one embodiment, the adhesion layer 1440 has a thickness of between about 10 nm and about 300 nm, such as between about 50 nm and about 150 nm. For example, the adhesion layer 1440 has a thickness between about 75 nm and about 125 nm, such as about 100 nm. The adhesion layer 1440 is formed by any suitable deposition process, including but not limited to chemical vapor deposition (CVD), physical vapor deposition (PVD), plasma enhanced CVD (PECVD), atomic layer deposition (ALD), or the like.

The optional seed layer 1442 may be formed on the adhesion layer 1440 or directly on the insulating layer 1018 (e.g., without the formation of the adhesion layer 1440). The seed layer 1442 is formed of a conductive material such as copper, tungsten, aluminum, silver, gold, or any other suitable materials or combinations thereof. In one embodiment, the seed layer 1442 has a thickness between about 50 nm and about 500 nm, such as between about 100 nm and about 300 nm. For example, the seed layer 1442 has a thickness between about 150 nm and about 250 nm, such as about 200 nm. In one embodiment, the seed layer 1442 has a thickness of between about 0.1 μm and about 1.5 μm. Similar to the adhesion layer 1440, the seed layer 1442 is formed by any suitable deposition process, such as CVD, PVD, PECVD, ALD dry processes, wet electroless plating processes, or the like. In one embodiment, a molybdenum adhesion layer 1440 is formed on the embedded die assembly in combination with a copper seed layer 1442. The Mo—Cu adhesion and seed layer combination enables improved adhesion with the surfaces of the insulating layer 1018 and reduces undercut of conductive interconnect lines during a subsequent seed layer etch process at operation 1370.

At operations 1320 and 1330, corresponding to FIGS. 14B and 14C, respectively, a spin-on/spray-on or dry resist film 1450, such as a photoresist, is applied on both major surfaces 1005, 1007 of the embedded die assembly 1002 and is subsequently patterned. In one embodiment, the resist film 1450 is patterned via selective exposure to UV radiation. In one embodiment, an adhesion promoter (not shown) is applied to the embedded die assembly 1002 prior to formation of the resist film 1450. The adhesion promoter improves adhesion of the resist film 1450 to the embedded die assembly 1002 by producing an interfacial bonding layer for the resist film 1450 and by removing any moisture from the surface of the embedded die assembly 1002. In some embodiments, the adhesion promoter is formed of bis(trimethylsilyl)amine or hexamethyldisilazane (HMDS) and propylene glycol monomethyl ether acetate (PGMEA).

At operation 1340 and FIG. 14D, the embedded die assembly 1002 is exposed to a resist film development process. As depicted in FIG. 14D, development of the resist film 1450 results in exposure of the through-assembly vias 1003 and contact holes 1032, now having an adhesion layer 1440 and a seed layer 1442 formed thereon. In one embodiment, the film development process is a wet process, such as a wet process that includes exposing the resist to a solvent. In one embodiment, the film development process is a wet etch process utilizing an aqueous etch process. In other embodiments, the film development process is a wet etch process utilizing a buffered etch process selective for a desired material. Any suitable wet solvents or combination of wet etchants may be used for the resist film development process.

Figure 14E:
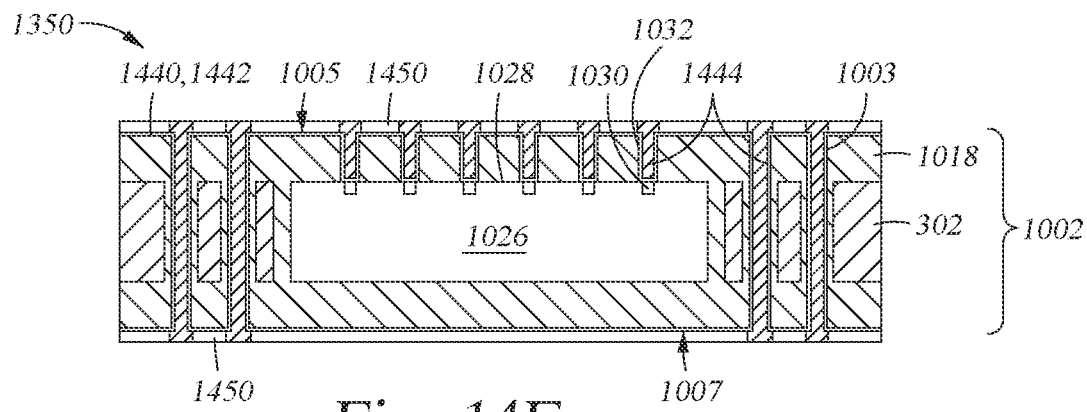
Figure 14F:
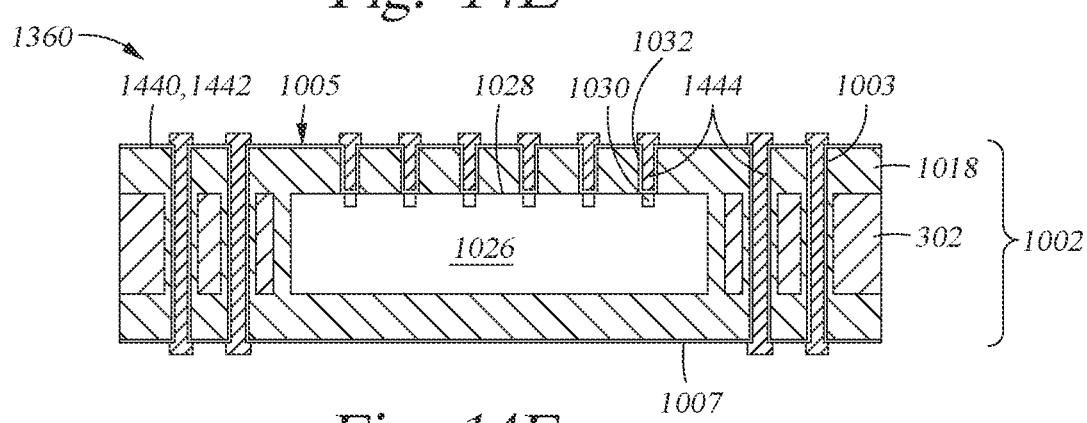

At operations 1350 and 1360, corresponding to FIGS. 14E and 14F respectively, interconnections 1444 are formed through the exposed through-assembly vias 1003 and contact holes 1032 and the resist film 1450 is thereafter removed. The interconnections 1444 are formed by any suitable methods including electroplating and electroless deposition. In one embodiment, the resist film 1450 is removed via a wet process. As depicted in FIGS. 14E and 14F, the formed interconnections 1444 fill the through-assembly vias 1003 and contact holes 1032 and/or cover inner circumferential walls thereof and protrude from the surfaces 1005, 1007, and 1028 of the embedded die assembly 1002 upon removal of the resist film 1450. In one embodiment, the interconnections 1444 are formed of copper. In other embodiments, the interconnections 1444 may be formed of any suitable conductive material including but not limited to aluminum, gold, nickel, silver, palladium, tin, or the like.

Figure 14G:
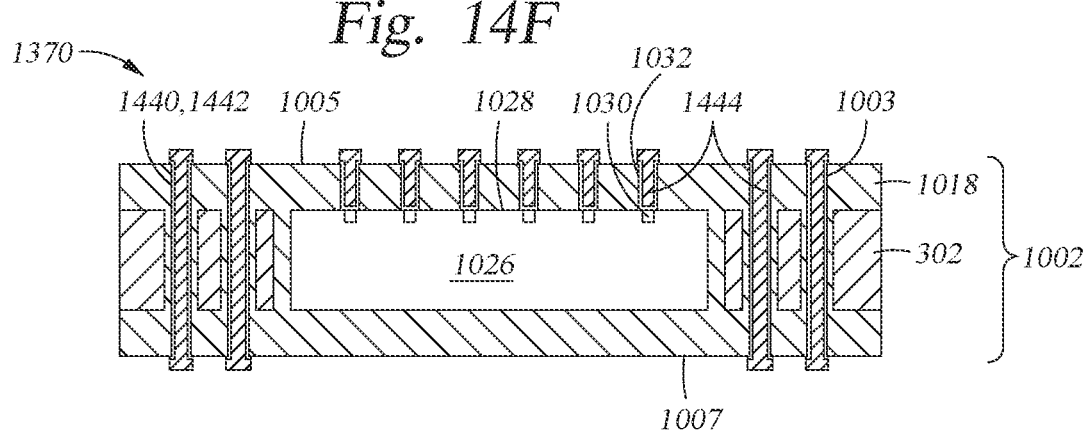
Figure 14H:
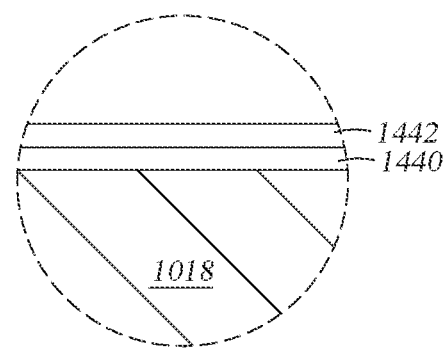

At operation 1370 and FIG. 14G, the embedded die assembly 1002 having interconnections 1444 formed therein is exposed to an adhesion and/or seed layer etch process to remove the adhesion layer 1440 and the seed layer 1442. In one embodiment, the seed layer etch is a wet etch process including a rinse and drying of the embedded die assembly 1002. In one embodiment, the seed layer etch process is a buffered etch process selective for a desired material such as copper, tungsten, aluminum, silver, or gold. In other embodiments, the etch process is an aqueous etch process. Any suitable wet etchant or combination of wet etchants may be used for the seed layer etch process.

Figure 15:
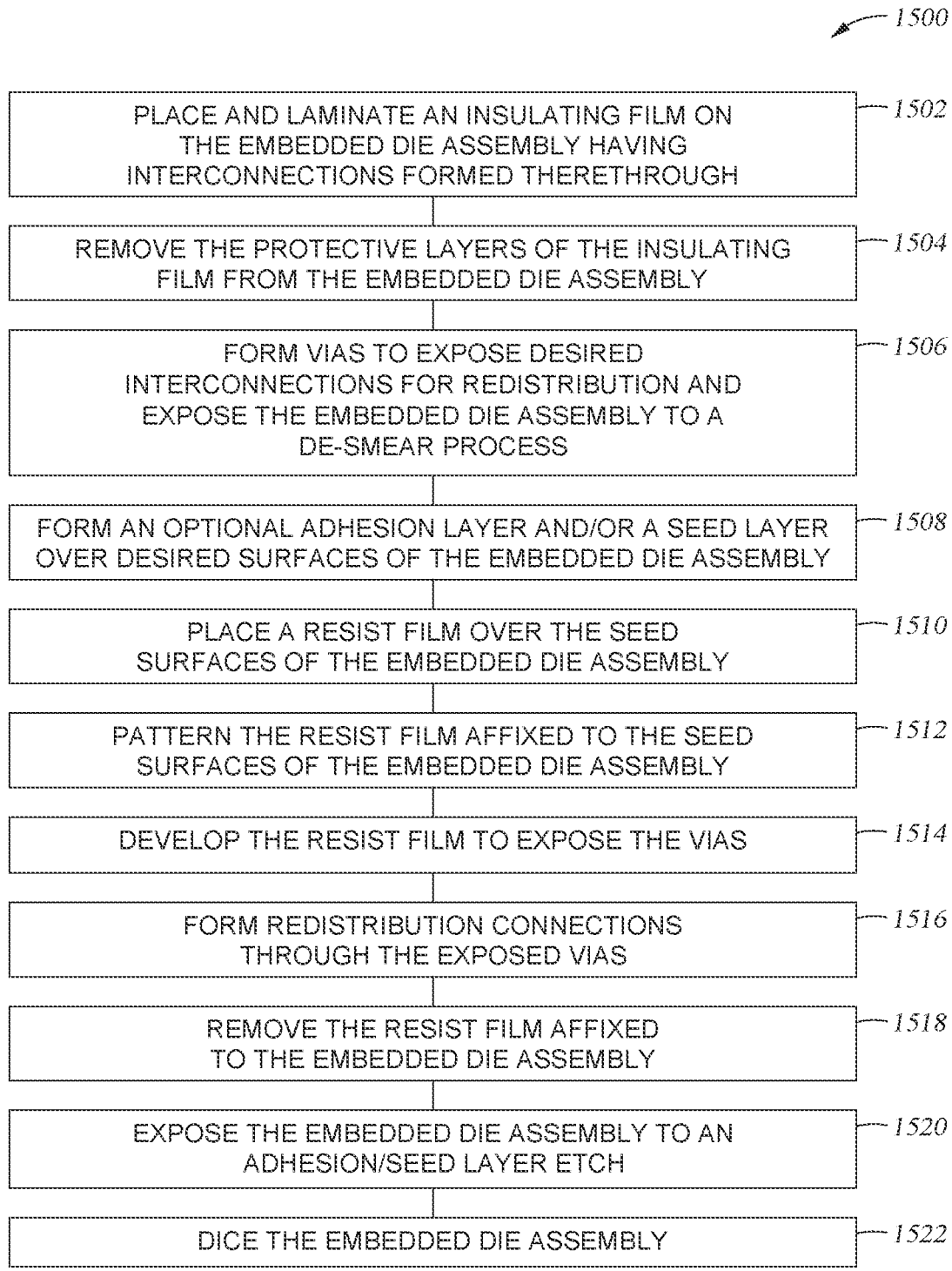
FIG. 15 illustrates a flow diagram of a process for forming a redistribution layer on an embedded die assembly followed by package singulation, according to an embodiment described herein.

Following the seed layer etch process at operation 1370, one or more electrically functioning packages may be singulated from the embedded die assembly 1002. Alternatively, the embedded die assembly 1002 may have one or more redistribution layers 1658 and/or 1660 (shown in FIGS. 16K-16L) formed thereon as needed to enable rerouting of contact points of the interconnections 1444 to desired locations on the surfaces of the embedded die assembly 1002. FIG. 15 illustrates a flow diagram of a representative method 1500 of forming a redistribution layer 1658 on the embedded die assembly 1002. FIGS. 16A-16L schematically illustrate cross-sectional views of the embedded die assembly 1002 at different stages of the method 1500 depicted in FIG. 15. Thus, FIG. 15 and FIGS. 16A-16L are herein described together for clarity.

Figure 16A:
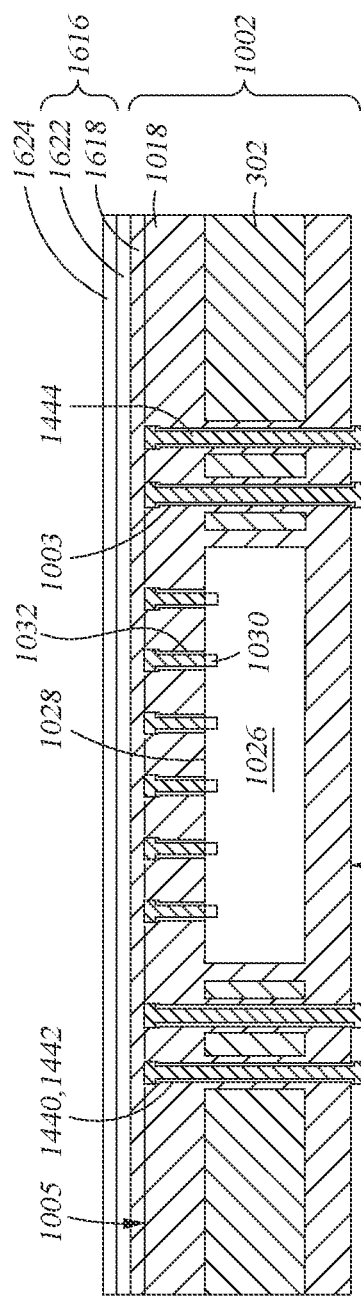

The method 1500 is substantially similar to the methods 900, 1100, and 1300 described above. Generally, the method 1500 begins at operation 1502 and FIG. 16A, wherein an insulating film 1616 is formed on the embedded die assembly 1002 and thereafter laminated. The insulating film 1616 may be substantially similar to the insulating film 1016 and includes one or more layers formed of polymer-based flowable dielectric materials. In one embodiment, as depicted in FIG. 16A, the insulating film 1616 includes a flowable epoxy resin layer 1618 and one or more protective layers 1622. In one embodiment, the insulating film 1616 may include a ceramic-filler-containing epoxy resin layer 1618 and one or more protective layers 1622. In another example, the insulating film 1616 may include a photodefinable polyimide layer 1618 and one or more protective layers 1622. The material properties of photodefinable polyimide enable the formation of smaller (e.g., narrower) vias through the resulting interconnect layer formed from the insulating film 1616. However, any suitable combination of layers and insulating materials is contemplated for the insulating film 1616. For example, the insulating film 1616 may be formed of a non-photosensitive polyimide, polybenzoxazole (PBO), silicon dioxide, and/or silicon nitride. In some examples, the insulating film 1616 is formed from a different polymer-based flowable dielectric material than the insulating films 1016. For example, the insulating films 1016 may include a ceramic-filler-containing epoxy resin layer and the insulating film 1616 may include a photodefinable polyimide layer. In another example, the insulating film 1616 is formed from a different inorganic dielectric material from the insulating films 1016. For example, the insulating films 1016 may include a ceramic-filler-containing epoxy resin layer and the insulating film 1616 may include a silicon dioxide layer.

The insulating film 1616 has a thickness of less than about 120 μm, such as between about 40 μm and about 100 μm. For example, the insulating film 1616 including the epoxy resin layer 1618 and the PET protective layer 1622 has a total thickness of between about 50 μm and about 90 μm. In one embodiment, the epoxy resin layer 1618 has a thickness of less than about 60 μm, such as a thickness between about 5 μm and about 50 μm, such as a thickness of about 20 μm. The insulating film 1616 is placed on a surface of the embedded die assembly 1002 having exposed interconnections 1444 that are coupled to the contacts 1030 on the active surface 1028 of dies 1026 and/or coupled to the metallized through-assembly vias 1003, such as the major surface 1005.

After placement of the insulating film 1616, the embedded die assembly 1002 is exposed to a lamination process substantially similar to the lamination process described with reference to operations 908, 916, and 1140. The embedded die assembly 1002 is exposed to elevated temperatures to soften the epoxy resin layer 1618, which subsequently bonds to the insulating layer 1018 already formed on the embedded die assembly 1002. Thus, in one embodiment, the epoxy resin layer 1618 becomes integrated with the insulating layer 1018 and forms an extension thereof. The integration of the epoxy resin layer 1618 and the insulating layer 1018 results in an expanded and integrated insulating layer 1018 covering the previously exposed interconnections 1444. Accordingly, the bonded epoxy resin layer 1618 and the insulating layer 1018 will herein be jointly described as the insulating layer 1018. In other embodiments, however, the lamination and subsequent curing of the epoxy resin layer 1618 forms a second insulating layer (not shown) on the insulating layer 1018. In some examples, the second insulating layer is formed of a different material layer than the insulating layer 1018.

In one embodiment, the lamination process is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between 10 psig and about 100 psig while a temperature of between about 80° C. and about 140° C. is applied to the substrate 302 and insulating film 1616 for a period between about 1 minute and about 30 minutes. For example, the lamination process is performed at a pressure of between about 30 psig and about 80 psig and a temperature of between about 100° C. and about 120° C. for a period between about 2 minutes and about 10 minutes. For example, the lamination process is performed at a temperature of about 110° C. for a period of about 5 minutes. In further examples, the lamination process is performed at a pressure between about 30 psig and about 70 psig, such as about 50 psig.

Figure 16B:
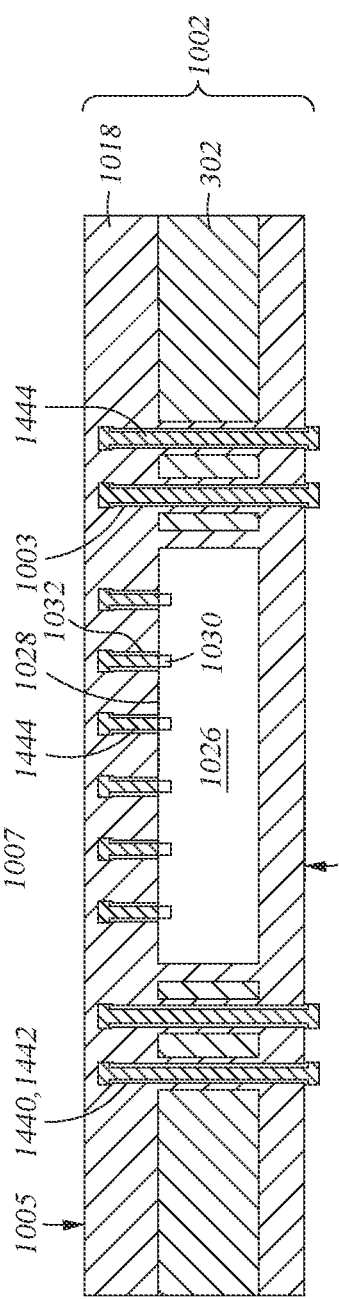

At operation 1504 and FIG. 16B, the protective layer 1622 and the carrier 1624 are removed from the embedded die assembly 1002 by mechanical processes. After removal of the protective layer 1622 and carrier 1624, the embedded die assembly 1002 is exposed to a cure process to fully cure the newly expanded insulating layer 1018. In one embodiment, the cure process is substantially similar to the cure process described with reference to operations 918 and 1150. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 1504 is performed at or near ambient pressure conditions.

Figure 16C:
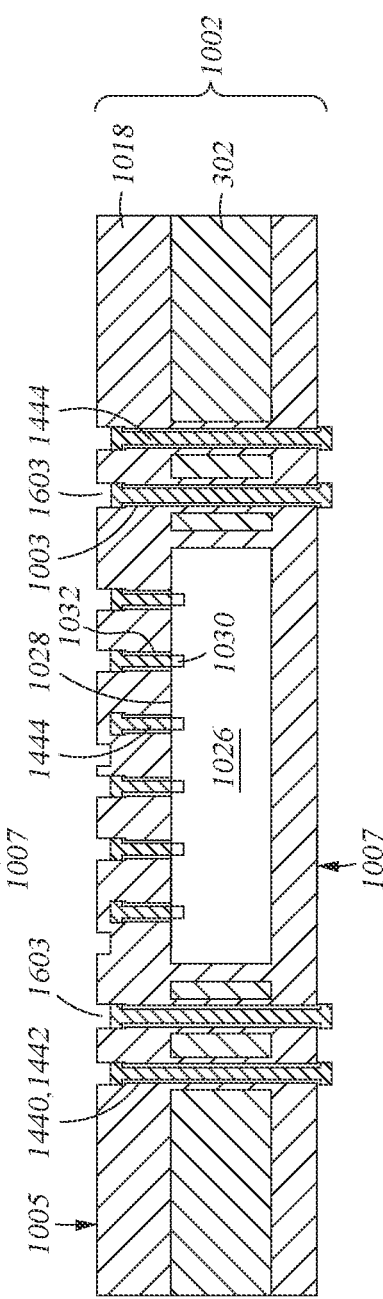

The embedded die assembly 1002 is then selectively patterned by laser ablation at operation 1506 and FIG. 16C. The laser ablation at operation 1506 forms redistribution vias 1603 through the newly expanded insulating layer 1018 and exposes desired interconnections 1444 for redistribution of contact points thereof. In one embodiment, the redistribution vias 1603 have a diameter of between about 5 μm and about 60 μm, such as a diameter of between about 10 μm and about 50 μm, such as between about 20 μm and about 45 μm. In one embodiment, the laser ablation process at operation 1506 is performed utilizing a $CO_2$ laser. In one embodiment, the laser ablation process at operation 1506 is performed utilizing a UV laser. In one embodiment, the laser ablation process at operation 1506 is performed utilizing a green laser. For example, the laser source may generate a pulsed laser beam having a frequency between about 100 kHz and about 1000 kHz. In one example, the laser source is configured to deliver a pulsed laser beam at a wavelength of between about 100 nm and about 2000 nm, at a pulse duration between about 10E-4 ns and about 10E-2 ns, and with a pulse energy of between about 10 μJ and about 300 μJ.

Upon patterning of the embedded die assembly 1002, the embedded die assembly 1002 is exposed to a de-smear process substantially similar to the de-smear process at operation 922 and 1170. During the de-smear process at operation 1506, t any unwanted residues and debris formed by laser ablation during the formation of the redistribution vias 1603 are removed from the redistribution vias 1603 to clear (e.g., clean) the surfaces thereof for subsequent metallization. In one embodiment, the de-smear process is a wet process. Any suitable aqueous etchants, solvents, and/or combinations thereof may be utilized for the wet de-smear process. In one example, $KMnO_4$ solution may be utilized as an etchant. In another embodiment, the de-smear process is a dry de-smear process. For example, the de-smear process may be a plasma de-smear process with an $O_2/CF_4$ mixture gas. In further embodiments, the de-smear process is a combination of wet and dry processes.

Figure 16D:
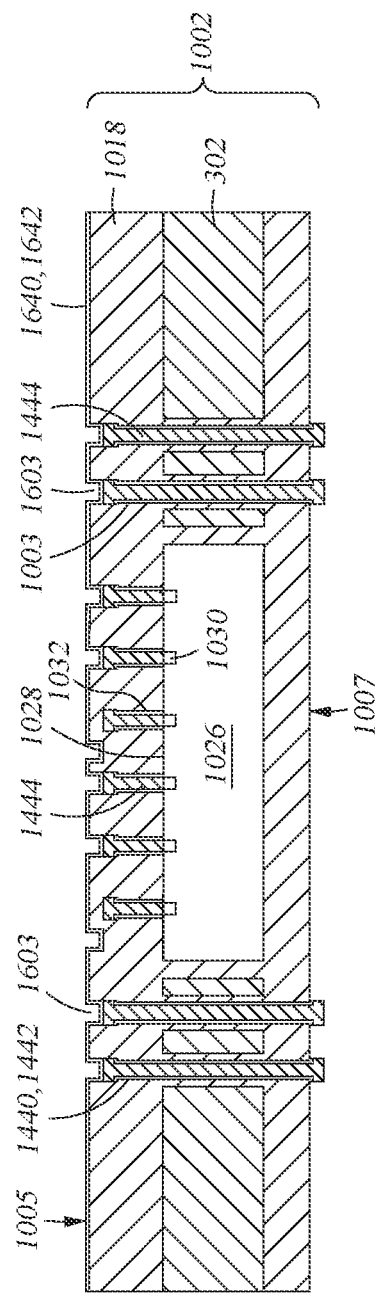

At operation 1508 and FIG. 16D, an optional adhesion layer 1640 and/or seed layer 1642 are formed on the insulating layer 1018. In one embodiment, the adhesion layer 1640 is formed from titanium, titanium nitride, tantalum, tantalum nitride, manganese, manganese oxide, molybdenum, cobalt oxide, cobalt nitride, or any other suitable materials or combinations thereof. In one embodiment, the adhesion layer 1640 has a thickness of between about 10 nm and about 300 nm, such as between about 50 nm and about 150 nm. For example, the adhesion layer 1640 has a thickness between about 75 nm and about 125 nm, such as about 100 nm. The adhesion layer 1640 may be formed by any suitable deposition process, including but not limited to CVD, PVD, PECVD, ALD, or the like.

The optional seed layer 1642 is formed from a conductive material such as copper, tungsten, aluminum, silver, gold, or any other suitable materials or combinations thereof. In one embodiment, the seed layer 1642 has a thickness between about 50 nm and about 500 nm, such as between about 100 nm and about 300 nm. For example, the seed layer 1642 has a thickness between about 150 nm and about 250 nm, such as about 200 nm. In one embodiment, the seed layer 1642 has a thickness of between about 0.1 μm and about 1.5 μm. Similar to the adhesion layer 1640, the seed layer 1642 may be formed by any suitable deposition process, such as CVD, PVD, PECVD, ALD dry processes, wet electroless plating processes, or the like. In one embodiment, a molybdenum adhesion layer 1640 and a copper seed layer 1642 are formed on the embedded die assembly 1002 to reduce undercut of conductive interconnect lines during a subsequent seed layer etch process at operation 1520.

Figure 16E:
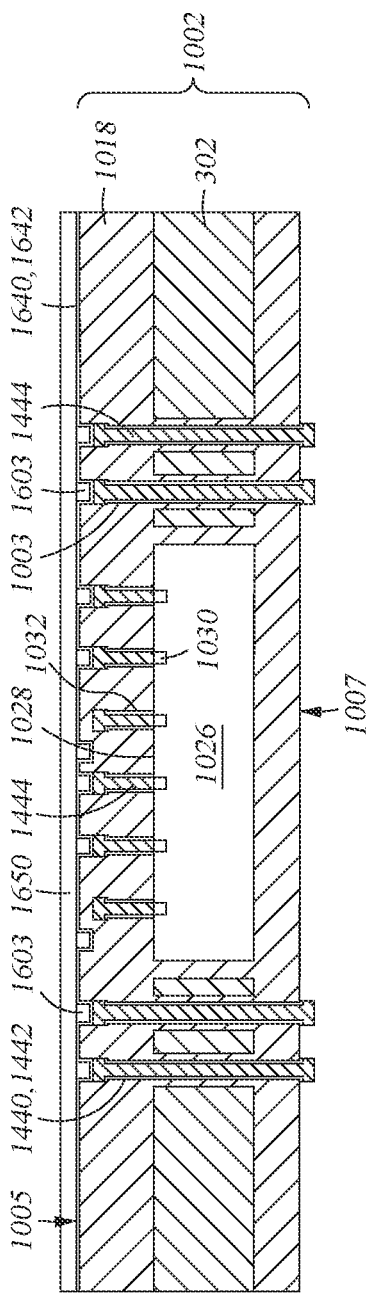

At operations 1510, 1512, and 1514, corresponding to FIGS. 16E, 16F, and 16G respectively, a spin-on/spray-on or dry resist film 1650, such as a photoresist, is applied over the adhesion and/or seed surfaces of the embedded die assembly 1002 and subsequently patterned and developed. In one embodiment, an adhesion promoter (not shown) is applied to the embedded die assembly 1002 prior to placement of the resist film 1650. The exposure and development of the resist film 1650 results in opening of the redistribution vias 1603. Thus, patterning of the resist film 1650 may be performed by selectively exposing portions of the resist film 1650 to UV radiation, and subsequent development of the resist film 1650 by a wet process, such as a wet etch process. In one embodiment, the resist film development process is a wet etch process utilizing a buffered etch process selective for a desired material. In other embodiments, the resist film development process is a wet etch process utilizing an aqueous etch process. Any suitable wet etchant or combination of wet etchants may be used for the resist film development process.

At operations 1516 and 1518, corresponding to FIGS. 16H and 16I respectively, redistribution connections 1644 are formed through the exposed redistribution vias 1603 and the resist film 1650 is thereafter removed. The redistribution connections 1644 are formed by any suitable methods including electroplating and electroless deposition. In one embodiment, the resist film 1650 is removed via a wet process. As depicted in FIGS. 16H and 16I, the redistribution connections 1644 fill the redistribution vias 1603 and protrude from the surfaces of the embedded die assembly 1002 upon removal of the resist film 1650. In one embodiment, the redistribution connections 1644 are formed of copper. In other embodiments, the redistribution connections 1644 may be formed of any suitable conductive material including but not limited to aluminum, gold, nickel, silver, palladium, tin, or the like.

At operation 1520 and FIG. 16J, the embedded die assembly 1002 having the redistribution connections 1644 formed thereon is exposed to a seed layer etch process substantially similar to that of operation 1370. In one embodiment, the seed layer etch is a wet etch process including a rinse and drying of the embedded die assembly 1002. In one embodiment, the seed layer etch process is a wet etch process utilizing a buffered etch process selective for a desired material of the seed layer 1642. In other embodiments, the etch process is a wet etch process utilizing an aqueous etch process. Any suitable wet etchant or combination of wet etchants may be used for the seed layer etch process.

Figure 16K:
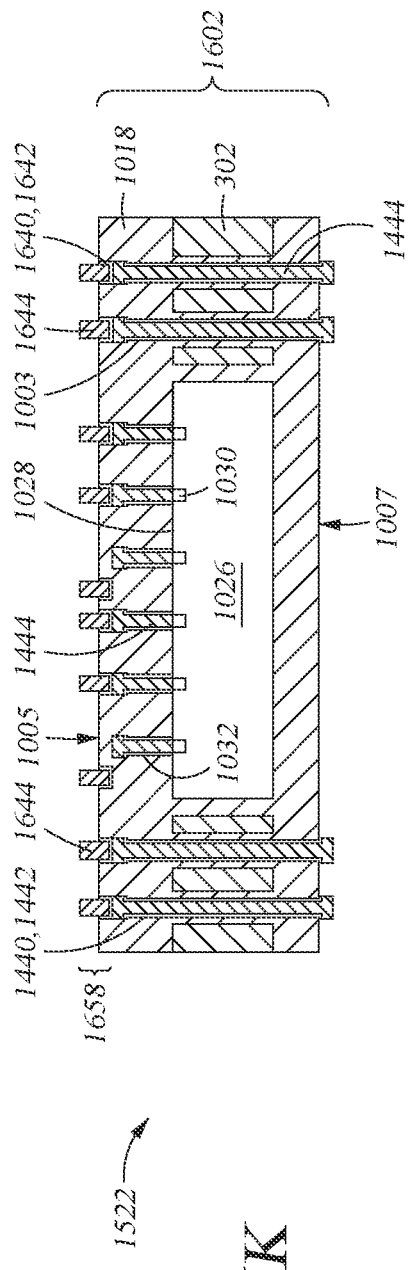
Figure 16L:
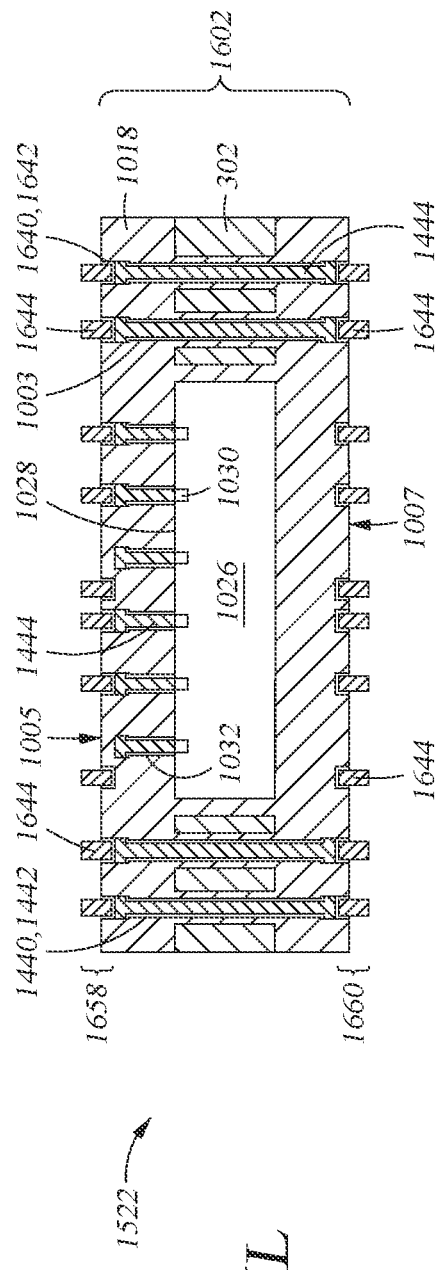

At operation 1522 and depicted in FIGS. 16K and 16L, one or more completed packages 1602 are singulated from the embedded die assembly 1002. Prior to operation 1522, however, additional redistribution layers may be formed on the embedded die assembly 1002 utilizing the sequences and processes described above, as depicted in FIG. 16L (FIG. 16K depicts the completed package 1602 having one additional redistribution layer 1658). For example, one or more additional redistribution layers 1660 may be formed on a side or surface of the embedded die assembly 1002 opposite of the first additional redistribution layer 1658, such as the major surface 1007. Alternatively, one or more additional redistribution layers 1660 may be formed on the same side or surface of the first additional redistribution layer 1658 (not shown), such as major surface 1005. The completed package 1602 may then be singulated from the embedded die assembly 1002 after all desired redistribution layers are formed.

Figure 17A:
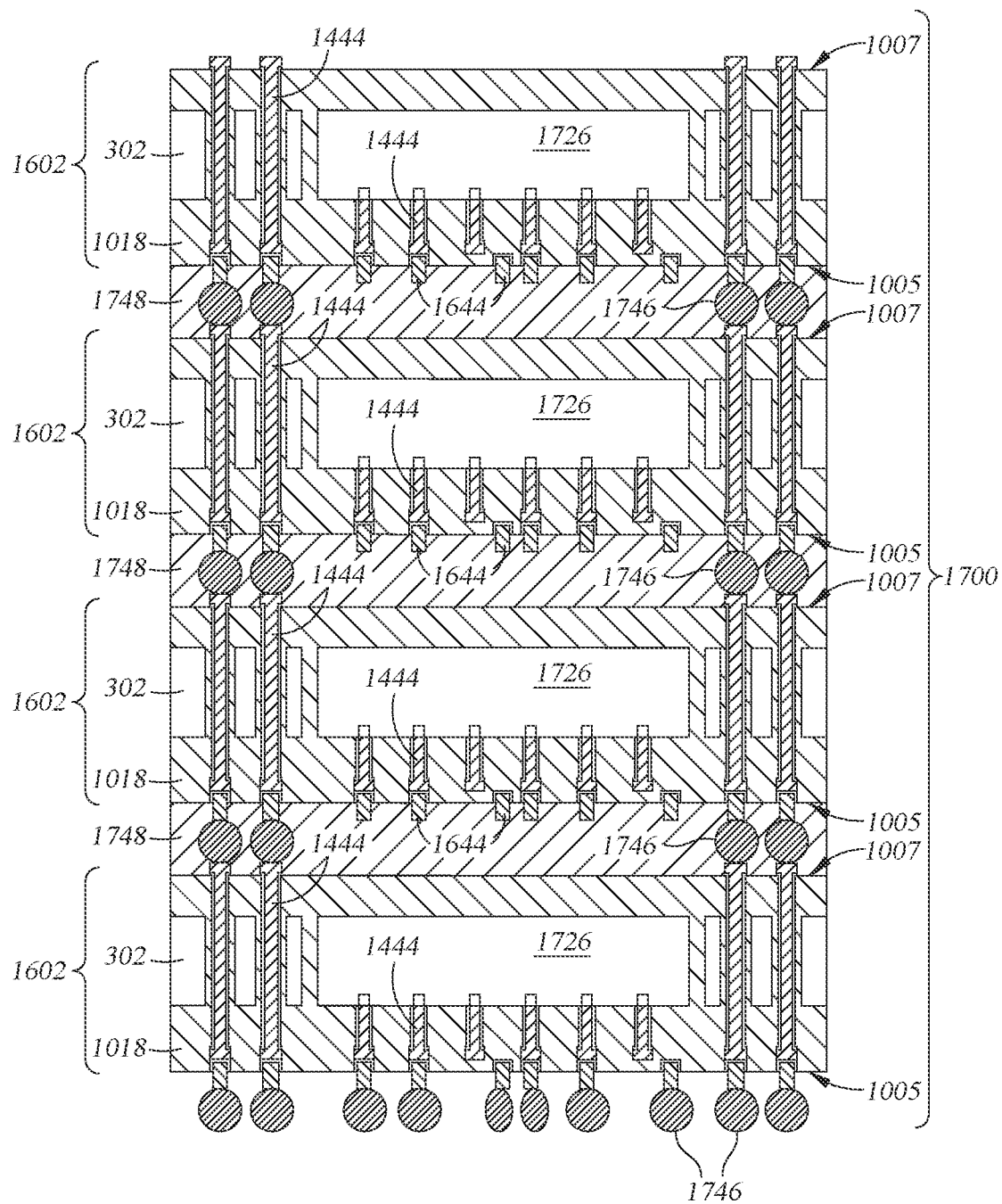
FIGS. 17A and 17B schematically illustrate cross-sectional views of dynamic random access memory (DRAM) stacks including a plurality of semiconductor packages formed utilizing the processes depicted in FIGS. 1-16L, according to embodiments described herein.

The packages 1602 formed at operation 1522 may be utilized in any suitable packaging application and in any suitable configuration. In one exemplary embodiment depicted in FIG. 17A, four packages 1602 are utilized to form a stacked DRAM structure 1700. Accordingly, each package 1602 includes a memory die 1726 (i.e., memory chip) embedded within the substrate 302 and encapsulated by the insulating layer 1018 (e.g., having a portion of each side in contact with the insulating layer 1018). One or more interconnections 1444 are formed though the entire thickness of each package 1602 and are directly in contact with one or more solder bumps 1746 disposed between major surfaces 1005 and 1007 of adjacent (i.e., stacked above or below) packages 1602. For example, as depicted in the stacked DRAM structure 1700, four or more solder bumps 1746 are disposed between adjacent packages 1602 to bridge (e.g., connect, couple) the interconnections 1444 of each package 1602 with the interconnections 1444 of an adjacent package 1602.

In one embodiment, voids between adjacent packages 1602 connected by the solder bumps 1746 are filled with an encapsulation material 1748 to enhance the reliability of the solder bumps 1746. The encapsulation material 1748 may be any suitable type of encapsulant or underfill. In one example, the encapsulation material 1748 includes a pre-assembly underfill material, such as a no-flow underfill (NUF) material, a nonconductive paste (NCP) material, and a nonconductive film (NCF) material. In one example, the encapsulation material 1748 includes a post-assembly underfill material, such as a capillary underfill (CUF) material and a molded underfill (MUF) material. In one embodiment, the encapsulation material 1748 includes a low-expansion-filler-containing resin, such as an epoxy resin filled with (e.g., containing) $SiO_2$, $AlN$, $Al_2O_3$, $SiC$, $Si_3N_4$, $Sr_2Ce_2Ti_5O_{16}$, $ZrSiO_4$, $CaSiO_3$, $BeO$, $CeO_2$, $BN$, $CaCu_3Ti_4O_{12}$, $MgO$, $TiO_2$, $ZnO$ and the like.

In one embodiment, the solder bumps 1746 are formed of one or more intermetallic compounds, such as a combination of tin (Sn) and lead (Pb), silver (Ag), Cu, or any other suitable metals thereof. For example, the solder bumps 1746 are formed of a solder alloy such as Sn—Pb, Sn—Ag, Sn—Cu, or any other suitable materials or combinations thereof. In one embodiment, the solder bumps 1746 include C4 (controlled collapse chip connection) bumps. In one embodiment, the solder bumps 1746 include C2 (chip connection, such as a Cu-pillar with a solder cap) bumps. Utilization of C2 solder bumps enables a smaller pitch between contact pads and improved thermal and/or electrical properties for the stacked DRAM structure 1700. In some embodiments, the solder bumps 1746 have a diameter between about 10 µm and about 150 µm, such as a diameter between about 50 µm and about 100 µm. The solder bumps 1746 may further be formed by any suitable wafer bumping processes, including but not limited to electrochemical deposition (ECD) and electroplating.

Figure 17B:
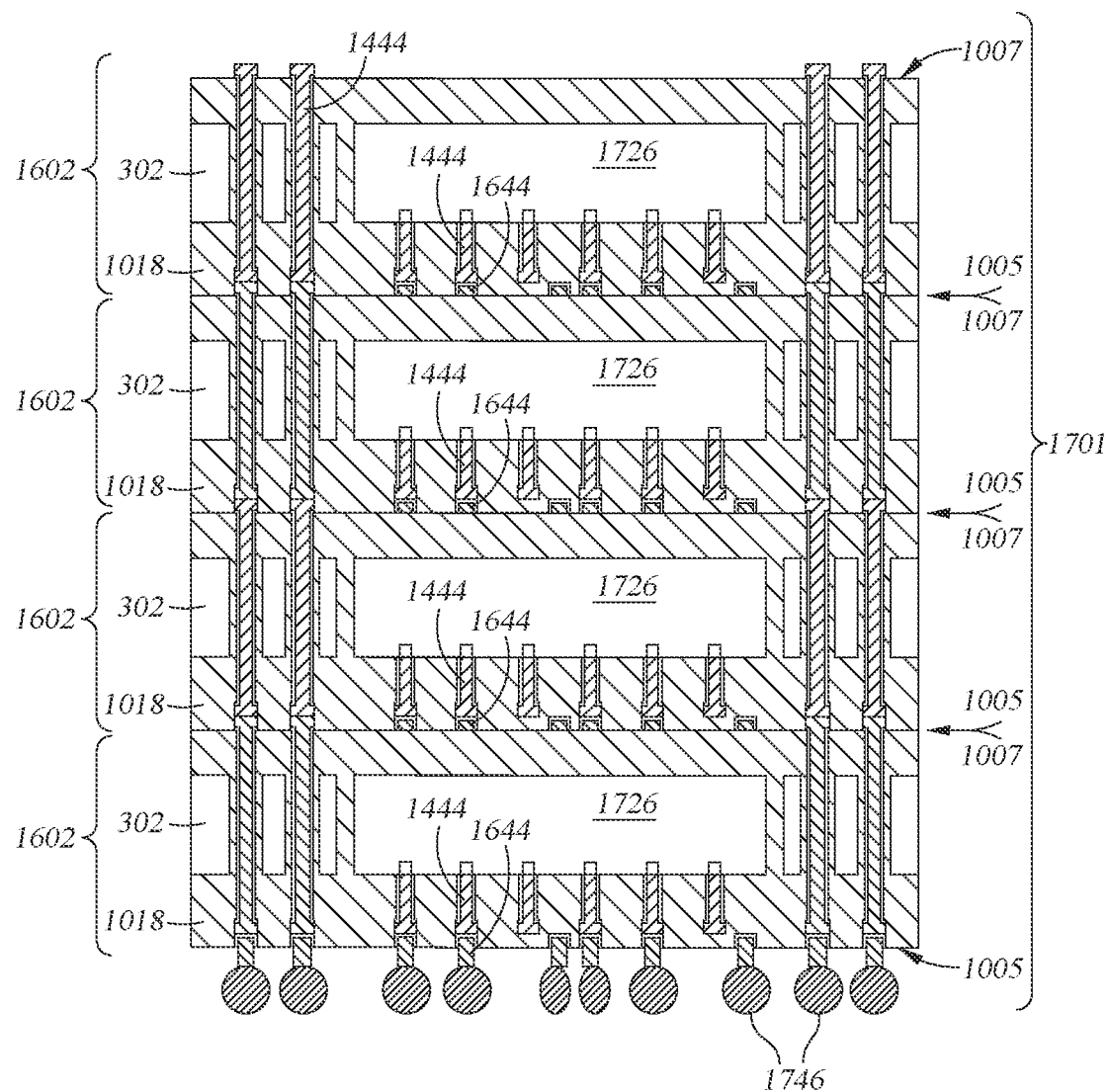

In another exemplary embodiment depicted in FIG. 17B, a stacked DRAM structure 1701 is formed by stacking four packages 1602 and directly bonding one or more interconnections 1444 of each package 1602 with the interconnections 1444 of one or more adjacent packages 1602. As depicted, the packages 1602 may be bonded by hybrid bonding, wherein major surfaces 1005 and 1007 of adjacent packages are planarized and in full contact with each other. Thus, one or more interconnections 1444 of each package 1602 are formed through the entire thickness of each package 1602 and are directly in contact with one or more interconnections 1444 of at least another adjacent package 1602.

The stacked DRAM structures 1700 and 1701 provide multiple advantages over conventional DRAM structures. Such benefits include thin form factor and high die-to-package volume ratio, which enable greater I/O scaling to meet the ever-increasing bandwidth and power efficiency demands of artificial intelligence (AI) and high performance computing (HPC). The utilization of a structured silicon frame provides optimal material stiffness and thermal conductivity for improved electrical performance, thermal management, and reliability of 3-dimensional integrated circuit (3D IC) architecture. Furthermore, the fabrication methods for through-assembly vias and via-in-via structures described herein provide high performance and flexibility for 3D integration with relatively low manufacturing costs as compared to conventional TSV technologies.

The embodiments described herein advantageously provide improved methods of substrate structuring and die assembling for fabricating advanced integrated circuit packages. By utilizing the methods described above, high aspect ratio features may be formed on glass and/or silicon substrates, thus enabling the economical formation of thinner and narrower semiconductor packages. The thin and small-form-factor packages fabricated by utilizing the methods described above provide the benefits of not only high I/O density and improved bandwidth and power, but also greater reliability with low stress attributed to the reduced weight/inertia and package architecture allowing flexible solder ball distribution. Further merits of the methods described above include economical manufacturing with dual-sided metallization capability and high production yield by eliminating flip-chip attachment and over-molding steps, which are prone to feature damage in high-volume manufacturing of conventional and advanced packages.

While the foregoing is directed to embodiments of the present disclosure, other and further embodiments of the disclosure may be devised without departing from the basic scope thereof, and the scope thereof is determined by the claims that follow.

What is claimed is:

1. A package structure, comprising:
   a frame, comprising:
   a silicon substrate having a first side opposite a second side;
   a quadrilateral cavity formed therein and extending through the substrate from the first side to the second side; and
   a plurality of cylindrical vias formed therein and extending through the substrate from the first side to the second side, the plurality of vias arranged in one or more rows on each side of the cavity;
   an active die disposed within the cavity;
   a first plurality of electrical interconnections, each of the first plurality of electrical interconnections disposed within one of the plurality of vias; and
   a dielectric layer formed over the first side and the second side, the dielectric layer disposed over each side of the active die and forming an intermediate layer between each of the first plurality of electrical interconnections and a sidewall of a corresponding via that the first electrical interconnection is disposed within.

2. The package structure of claim 1, wherein the substrate comprises crystalline silicon.

3. The package structure of claim 2, wherein the substrate comprises monocrystalline p-type or n-type silicon.

4. The package structure of claim 1, wherein the substrate has a thickness between about 110 μm and about 200 μm.

5. The package structure of claim 1, wherein the dielectric layer has a thickness less than about 150 μm between the active die and a sidewall of the cavity.

6. The package structure of claim 1, the intermediate layer has a thickness less than about 150 μm between each of the first plurality of electrical interconnections and a sidewall of the corresponding via that the first electrical interconnection is disposed within.

7. The package structure of claim 1, further comprising an oxide layer formed over the first side and the second side of the substrate.

8. The package structure of claim 7, wherein the oxide layer has a thickness between about 300 nm and about 2 μm.

9. The package structure of claim 1, wherein the dielectric layer comprises a laminated epoxy resin having a ceramic filler.

10. The package structure of claim 9, wherein the ceramic filler comprises at least one of silica, aluminum nitride, aluminum oxide, silicon carbide, silicon nitride, zirconium silicate, wollastonite, beryllium oxide, cerium dioxide, boron nitride, calcium copper titanium oxide, magnesium oxide, titanium dioxide, and zinc oxide.

11. The package structure of claim 1, further comprising a second plurality of electrical interconnections formed through the dielectric layer and in electrical contact with the active die.

12. The package structure of claim 1, wherein a minimum pitch between each of the plurality of vias is between about 70 μm and about 200 μm.

13. The package structure of claim 1, further comprising a molybdenum layer and a copper layer formed within each of the plurality of vias and disposed between the electrical interconnection and the dielectric layer in the via.

14. A package structure, comprising:
a frame, comprising:
   a silicon substrate having a first side opposite a second side;
   a quadrilateral cavity formed therein and extending through the substrate from the first side to the second side;
   a plurality of cylindrical vias formed therein and extending through the substrate from the first side to the second side, the plurality of vias arranged in one or more rows on each side of the cavity; and
   an oxide layer formed over the first side, the second side, and sidewalls of the cavity and sidewalls of each of the plurality of vias;
at least one active multipurpose die disposed within the cavity;
a first plurality of electrical interconnections, each of the first plurality of electrical interconnections disposed within one of the plurality of vias and extending at least from the first side to the second side;
a dielectric layer formed over the first side and the second side, the dielectric layer disposed over each side of the at least one active multipurpose die and forming an intermediate layer between each of the first plurality of electrical interconnections and the sidewall of a corresponding via the first electrical interconnection is disposed within, the dielectric layer comprising a laminated epoxy resin filled with ceramic fillers; and
a second plurality of electrical interconnections formed through the dielectric layer and in electrical communication with the at least one active multipurpose die.

15. The package structure of claim 14, wherein the substrate comprises a monocrystalline p-type or n-type silicon solar substrate.

16. The package structure of claim 14, wherein the dielectric layer has a thickness less than about 150 μm between the at least one active multipurpose die and the sidewalls of the cavity.

17. The package structure of claim 14, the intermediate layer has a thickness less than about 150 μm between each of the first plurality of electrical interconnections and the sidewall of the corresponding via that the first electrical interconnection is disposed within.

18. The package structure of claim 14, further comprising:
a third plurality of conductive interconnections partially formed through the dielectric layer, the third plurality of interconnections forming a redistribution layer over the first side or the second side.

19. A stacked package structure, comprising:
a first frame, comprising:
   a first silicon substrate having a first side opposite a second side;
   a first cavity formed therein and extending through the first substrate from the first side to the second side; and
   a first plurality of vias formed therein and extending through the first substrate from the first side to the second side;
a second frame stacked over the first frame, comprising:
   a second silicon substrate having a first side opposite a side;
   a second cavity formed therein and extending through the second substrate from the first side to the second side; and
   a second plurality of vias formed therein and extending through the second substrate from the first side to the second side;
an active die disposed within each of the first cavity and the second cavity;
a plurality of electrical interconnections, each of the plurality of electrical interconnections disposed within one of the first or second pluralities of vias; and
a dielectric layer in contact with the first frame and the second frame and separating each of the first frame and the second frame, the dielectric layer disposed over each side of the active dies and forming an intermediate layer between each of the plurality of electrical interconnections and a sidewall of a corresponding via the electrical interconnection is disposed within.

20. The stacked package structure of claim 19, further comprising an oxide layer formed over each of the first substrate and the second substrate.

* * * * *